(12) United States Patent
Miyakoshi

(10) Patent No.: US 12,184,999 B2
(45) Date of Patent: *Dec. 31, 2024

(54) SOLID STATE IMAGE SENSOR AND ELECTRONIC EQUIPMENT FOR IMPROVING IMAGE QUALITY

(71) Applicant: SONY GROUP CORPORATION, Tokyo (JP)

(72) Inventor: Daisuke Miyakoshi, Kanagawa (JP)

(73) Assignee: SONY GROUP CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 18/191,586

(22) Filed: Mar. 28, 2023

(65) Prior Publication Data
US 2023/0239589 A1  Jul. 27, 2023

Related U.S. Application Data

(63) Continuation of application No. 17/647,562, filed on Jan. 10, 2022, now Pat. No. 11,637,975, which is a
(Continued)

(30) Foreign Application Priority Data

Apr. 25, 2017  (JP) .................... 2017-085906

(51) Int. Cl.
*H04N 25/583* (2023.01)
*G02B 7/09* (2021.01)
(Continued)

(52) U.S. Cl.
CPC ............. *H04N 25/583* (2023.01); *G02B 7/09* (2013.01); *H01L 27/14605* (2013.01);
(Continued)

(58) Field of Classification Search
CPC .... H04N 25/583; H04N 23/12; H04N 25/133; H04N 25/585; H04N 25/633;
(Continued)

(56) References Cited

U.S. PATENT DOCUMENTS

2010/0091161 A1* 4/2010 Suzuki ............... H04N 25/134
  348/E5.091
2012/0212654 A1 8/2012 Nagata
(Continued)

FOREIGN PATENT DOCUMENTS

CN 102685406 A 9/2012
CN 103685987 A 3/2014
(Continued)

OTHER PUBLICATIONS

Extended European Search Report of EP Application No. 22151852. 5, issued on Jun. 15, 2022, 09 pages.
(Continued)

*Primary Examiner* — Gevell V Selby
(74) *Attorney, Agent, or Firm* — CHIP LAW GROUP

(57) ABSTRACT

The present disclosure relates to a solid state image sensor and electronic equipment that enable degradation in image quality of a captured image to be suppressed even if any pixel in a pixel array is configured as a functional pixel for obtaining desired information in order to obtain information different from a normal image. In a plurality of pixels constituting subblocks provided in an RGB Bayer array constituting a block which is a set of color units, normal pixels that capture a normal image are arranged longitudinally and laterally symmetrically within the subblock, and functional pixels for obtaining desired information other than capturing an image are arranged at the remaining positions. The present disclosure can be applied to a solid state image sensor.

11 Claims, 32 Drawing Sheets

Related U.S. Application Data continuation of application No. 16/603,065, filed as application No. PCT/JP2018/015157 on Apr. 11, 2018, now Pat. No. 11,233,957.

(51) Int. Cl.
| | |
|---|---|
| *H01L 27/146* | (2006.01) |
| *H04N 23/12* | (2023.01) |
| *H04N 25/133* | (2023.01) |
| *H04N 25/585* | (2023.01) |
| *H04N 25/633* | (2023.01) |
| *H04N 25/772* | (2023.01) |

(52) U.S. Cl.
CPC ........... *H04N 23/12* (2023.01); *H04N 25/133* (2023.01); *H04N 25/585* (2023.01); *H04N 25/633* (2023.01); *H04N 25/772* (2023.01); *H01L 27/14621* (2013.01); *H01L 27/14623* (2013.01); *H01L 27/14627* (2013.01)

(58) Field of Classification Search
CPC ...... H04N 25/772; H04N 25/11; H04N 25/63; H04N 25/702; H04N 23/672; H04N 25/46; H04N 25/587; H04N 25/589; H04N 25/704; G02B 7/09; G02B 5/201; G02B 7/34; H01L 27/14605; H01L 27/14621; H01L 27/14623; H01L 27/14627; H01L 27/14645; H01L 27/14607
See application file for complete search history.

(56) References Cited

U.S. PATENT DOCUMENTS

| | | |
|---|---|---|
| 2014/0085516 A1 | 3/2014 | Maeda |
| 2014/0176780 A1* | 6/2014 | Koshiba ............... H04N 25/134 348/336 |
| 2014/0253808 A1 | 9/2014 | Tachi |
| 2014/0307133 A1 | 10/2014 | Kawai et al. |
| 2015/0109498 A1 | 4/2015 | Aoki et al. |
| 2016/0219232 A1 | 7/2016 | Murata |
| 2016/0276396 A1 | 9/2016 | Tayanaka et al. |
| 2016/0366329 A1 | 12/2016 | Sasaki |
| 2019/0281226 A1* | 9/2019 | Wang ................... H04N 25/133 |
| 2020/0099873 A1* | 3/2020 | Hwang ................. H04N 25/59 |
| 2020/0314362 A1 | 10/2020 | Roh et al. |
| 2022/0150451 A1* | 5/2022 | Hoshino ................ H04N 25/46 |

FOREIGN PATENT DOCUMENTS

| | | |
|---|---|---|
| CN | 104969540 A | 10/2015 |
| JP | 2013-175898 A | 9/2013 |
| JP | 2014-135564 A | 7/2014 |
| JP | 5740054 B2 | 6/2015 |
| JP | 2015-133469 A | 7/2015 |
| JP | 5787856 B2 | 9/2015 |
| JP | 2016-100879 A | 5/2016 |
| JP | 5954964 B2 | 7/2016 |
| JP | 5233188 B2 | 11/2017 |
| KR | 10-2014-0039970 A | 4/2014 |
| KR | 10-2016-0097121 A | 8/2016 |
| TW | 201523861 A | 6/2015 |
| WO | 2014/006784 A1 | 1/2014 |
| WO | 2015/087515 A2 | 6/2015 |

OTHER PUBLICATIONS

Extended European Search Report of EP Application No. 18790913.0, issued on Jan. 30, 2020, 09 pages.
International Search Report and Written Opinion of PCT Application No. PCT/JP2018/015157, issued on Jun. 5, 2018, 05 pages of English Translation and 05 pages of ISRWO.
Non-Final Office Action for U.S. Appl. No. 16/603,065, issued on Feb. 18, 2021, 13 pages.
Final Office Action for U.S. Appl. No. 16/603,065, issued on Jun. 3, 2021, 13 pages.
Advisory Action for U.S. Appl. No. 16/603,065, issued on Aug. 20, 2021, 3 pages.
Notice of Allowance for U.S. Appl. No. 16/603,065, issued on Sep. 15, 2021, 8 pages.
International Preliminary Report on Patentability of PCT Application No. PCT/JP2018/015157, issued on Nov. 7, 2019, 06 pages of English Translation and 03 pages of IPRP.
Notice of Allowance for U.S. Appl. No. 17/647,562, issued on Dec. 28, 2022, 8 pages.

* cited by examiner

SOLID STATE IMAGE SENSOR AND ELECTRONIC EQUIPMENT FOR IMPROVING IMAGE QUALITY

The present application is a continuation application of U.S. patent application Ser. No. 17/647,562, filed on Jan. 10, 2022, which is a continuation application of U.S. patent application Ser. No. 16/603,065 filed Oct. 4, 2019, now a patent U.S. Pat. No. 11,233,957, which is a national stage entry of PCT/JP2018/015157, filed Apr. 11, 2018, which claims priority from prior Japanese Priority Patent Application JP 2017-085906 filed in the Japan Patent Office on Apr. 25, 2017 the entire contents of which are hereby incorporated by reference.

TECHNICAL FIELD

The present disclosure relates to a solid state image sensor and electronic equipment, and particularly relates to a solid state image sensor and electronic equipment that can suppress degradation in image quality of a captured image even if any pixel in a pixel array is configured as a functional pixel dedicated for obtaining desired information in order to obtain information different from a normal image.

BACKGROUND ART

In recent years, imaging devices such as digital still cameras and digital video cameras that image a subject such as a human or an animal using an image sensor such as a complementary metal-oxide semiconductor (CMOS) sensor, and record image data obtained as a consequence are widely used.

A technology is known in which, in such an imaging device, a phase difference detection function is imparted to an image sensor, and auto focus (AF) in a phase difference detection system is achieved without using a dedicated auto focus (AF) sensor. For example, Patent Document 1 proposes configuring one block with 2×2 (=4) pixels of the same color and setting one pixel in that block as a phase difference detection pixel.

In the example of Patent Document 1, a phase difference detection pixel is arranged for the upper right pixel in a block of 2×2 green (G) pixels on the left side at the center. In contrast, in a block of 2×2 green (G) pixels on the right side at the center, a phase difference detection pixel is arranged for the upper left pixel.

In a phase difference detection pixel, a light shielding part is provided on the right half or left half of the pixel, for example, and the opposite side of the light shielding part is a light transmitting part. A phase difference is detected from a difference in output between paired phase difference detection pixels whose light shielding parts are positioned oppositely, and a defocus amount is computed on the basis of the phase difference. Then, a focus state is controlled on the basis of the computed defocus amount.

CITATION LIST

Patent Document

Patent Document 1: Japanese Patent Application Laid-Open No. 2015-133469

SUMMARY OF THE INVENTION

Problems to be Solved by the Invention

However, in the technology described in Patent Document 1, it is necessary to configure any pixel in the Bayer array as a dedicated pixel for obtaining desired information in order to obtain information different from a normal image, and there is an influence such as local aliasing on image quality degradation.

The present disclosure was made in view of such circumstances, and particularly enables degradation in image quality of a captured image to be suppressed even if any pixel in a pixel array is configured as a functional pixel dedicated for obtaining desired information in order to obtain information different from a normal image.

Solutions to Problems

According to an aspect of the present disclosure, there is provided a solid state image sensor including: an image sensor including a normal pixel including a pixel configured to capture an image and produce a corresponding pixel signal, and a functional pixel including a pixel configured to produce a signal necessary for capturing the image, in which the image captured by the image sensor includes a block which is a set of color units, the block is configured by arranging, for each color, a subblock including a plurality of pixels of an identical color in a predetermined color array, and in an arrangement of the plurality of pixels included in the subblock, the normal pixels are arranged longitudinally and laterally symmetrically within the subblock.

The color array may be a Bayer array, a stripe array, a checkboard array, or an interline array.

Respective pixel signals of the plurality of normal pixels included in the subblock are added and output as a pixel signal of normal addition pixels on the subblock basis.

The functional pixel is a pixel having a function identical to a function of the normal pixels, and may capture the image in an exposure duration different from an exposure duration of the normal pixels and with an identical sensitivity.

The functional pixel is a pixel having a function identical to a function of the normal pixels, and may capture the image in an exposure duration identical to an exposure duration of the normal pixels and with a different sensitivity.

The functional pixel may be a phase difference detection pixel that detects a phase difference that conforms to a focal length.

After outputting a signal indicating the phase difference detected by the functional pixel including the phase difference detection pixel, the image sensor may output the pixel signal of the normal pixels.

A lens configured to adjust a focus of light incident on the image sensor, and a lens control unit configured to control a focal length of the lens may further be included. The lens control unit may calculate a defocus amount of the lens in accordance with the phase difference detected by the phase difference detection pixel, and control the focal length of the lens on the basis of the defocus amount.

The phase difference detection pixel may detect a phase difference in a horizontal direction.

The phase difference detection pixel may detect a phase difference in a vertical direction.

The functional pixel may be a black pixel, and may output a black level.

The black pixel may be a pixel fully shielded from light.

A clamp unit configured to subtract the black level of the black pixel from the pixel signal of the normal addition pixels for clamping may further be included.

The functional pixel may be a white pixel, and outputs a luminance signal.

The white pixel may be a pixel whose color filter is transparent or a pixel without the color filter.

A low pass filter (LPF) unit configured to subject the pixel signal of the normal addition pixels to an LPF, a high pass filter (HPF) unit configured to subject the luminance signal to an HPF, and an addition unit configured to add an output of the LPF unit and an output of the HPF unit may further be included.

A column AD conversion unit configured to subject signals output from the pixels constituting the image sensor and arranged in an array to analog digital conversion on a row basis may further be included. The column AD conversion units may be provided by a multiple of the number of rows included in the subblock.

According to an aspect of the present disclosure, there is provided electronic equipment including an image sensor including a normal pixel including a pixel configured to capture an image and produce a corresponding pixel signal, and a functional pixel including a pixel configured to produce a signal necessary for capturing the image, in which the image captured by the image sensor includes a block which is a set of color units, the block is configured by arranging, for each color, a subblock including a plurality of pixels of an identical color in a predetermined color array, and in an arrangement of the plurality of pixels included in the subblock, the normal pixels are arranged longitudinally and laterally symmetrically within the subblock.

According to an aspect of the present disclosure, an image sensor including a normal pixel including a pixel configured to capture an image and produce a corresponding pixel signal, and a functional pixel including a pixel configured to produce a signal necessary for capturing the image may be included. The image captured by the image sensor includes a block which is a set of color units, the block is configured by arranging, for each color, a subblock including a plurality of pixels of an identical color in a predetermined color array, and in an arrangement of the plurality of pixels included in the subblock, the normal pixels are arranged longitudinally and laterally symmetrically within the subblock.

Effects of the Invention

According to an aspect of the present disclosure, degradation in image quality of a captured image can be suppressed even if any pixel in a pixel array is configured as a functional pixel dedicated for obtaining desired information in order to obtain information different from a normal image.

MODE FOR CARRYING OUT THE INVENTION

Figure 1:
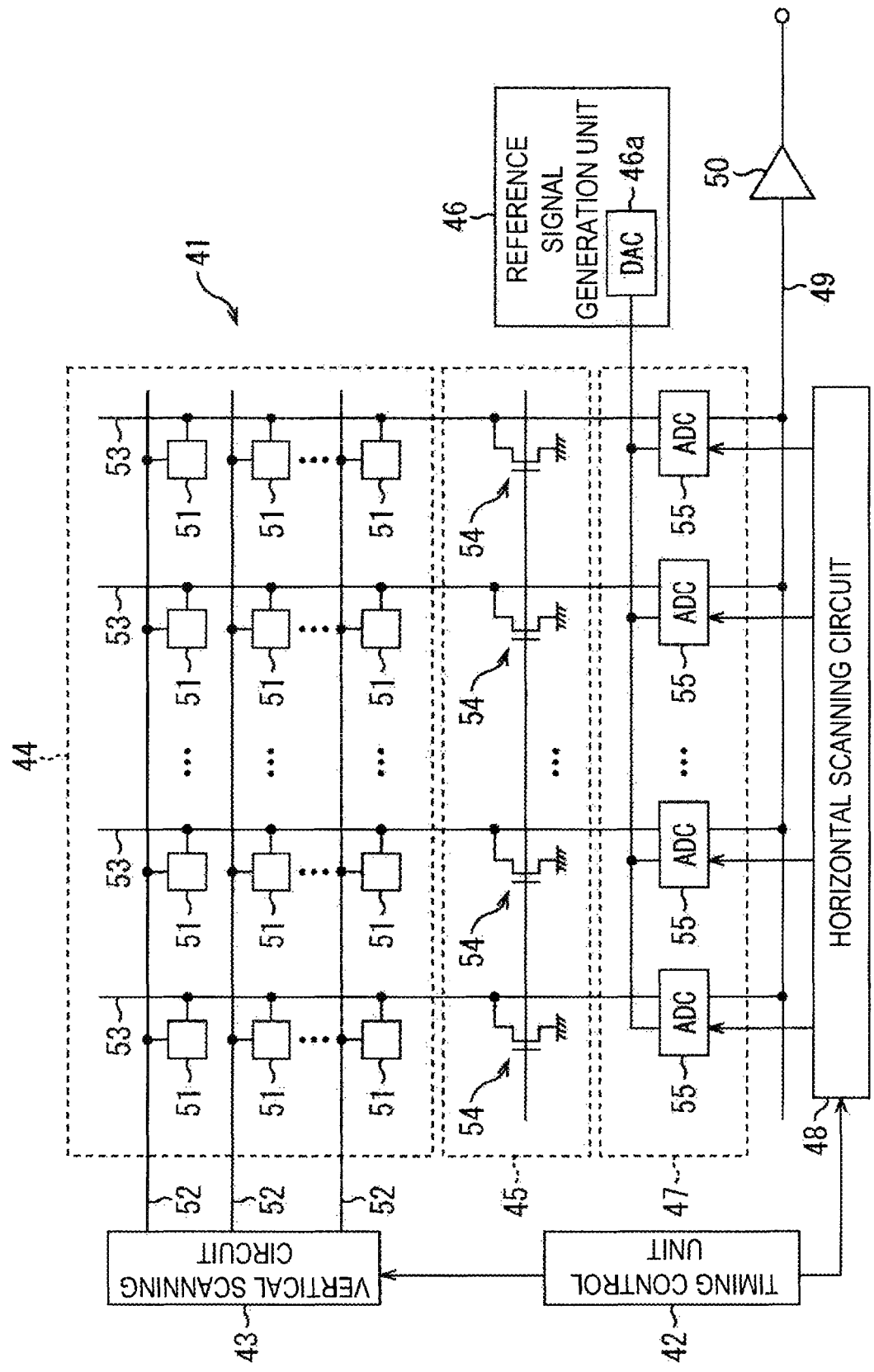
FIG. 1 is a block diagram showing a configuration example of a first embodiment of an image sensor to which the present technology has been applied.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

In addition, description will be provided in the following order.
1. First embodiment
   (1-1) Pixel arrangement (FIGS. 1 to 4)
   (1-2) Configuration example of first embodiment of electronic equipment (FIGS. 5 and 6)
   (1-3) Imaging processing performed by electronic equipment of FIG. 5 (FIG. 7)
2. Second embodiment
   (2-1) Simultaneous imaging of high frame rate imaging and normal frame rate imaging (FIG. 8)
   (2-2) Dynamic range enlargement imaging (FIG. 9)
   (2-3) Configuration example of second embodiment of electronic equipment (FIG. 10)
   (2-4) Imaging processing performed by electronic equipment of FIG. 10 (FIG. 11)
3. Third embodiment
   (3-1) Pixel arrangement example including normal addition pixels and phase difference detection pixels (FIGS. 12 to 14)
   (3-2) Principle of phase difference detection (FIGS. 15 to 17)
   (3-3) Configuration example of third embodiment of electronic equipment (FIG. 18)
   (3-4) Phase difference auto focus processing (FIGS. 19 and 20)
   (3-5) Modification example of third embodiment (pixel arrangement example of providing phase difference detection pixel or black pixel within subblock) (FIG. 21)
4. Fourth embodiment
   (4-1) Pixel arrangement example through use of white pixel (FIG. 22)
   (4-2) Configuration example of fourth embodiment of electronic equipment (FIG. 23)
   (4-3) Configuration example of correction unit (FIG. 24)
   (4-4) Imaging processing performed by electronic equipment of FIG. 23 (FIG. 25)
   (4-5) Correction processing (FIG. 26)
   (4-6) Modification example of fourth embodiment (configuration example of providing white pixel or phase difference detection pixel within subblock) (FIG. 27)
5. Timing of outputting pixel signal from image sensor (FIG. 28)
6. Arrangement example of column AD conversion units (FIG. 29)
7. Variations of pixel arrangement (FIGS. 30 to 33)

1. First Embodiment (1-1) Pixel Arrangement

FIG. 1 is a block diagram showing a configuration example of an embodiment of an image sensor to which the present technology has been applied.

An image sensor 41 in FIG. 1 is configured by providing a timing control unit 42, a vertical scanning circuit 43, a pixel array 44, a constant current source circuit unit 45, a reference signal generation unit 46, and a column analog to digital (AD) conversion unit 47 on a semiconductor substrate not shown. A horizontal scanning circuit 48, a horizontal output line 49, and an output circuit 50 are further provided.

The timing control unit 42 supplies a clock signal and a timing signal necessary for predetermined operations to the vertical scanning circuit 43 and the horizontal scanning circuit 48 on the basis of a master clock of a predetermined frequency. For example, the timing control unit 42 supplies timing signals for a shutter operation and a readout operation for a pixel 51 to the vertical scanning circuit 43 and the horizontal scanning circuit 48. In addition, although illustration is omitted, the timing control unit 42 also supplies a clock signal and a timing signal necessary for predetermined operations to the reference signal generation unit 46, the column AD conversion unit 47, and the like.

The vertical scanning circuit 43 sequentially supplies a signal that controls output of a pixel signal at a predetermined timing to each of the pixels 51 aligned in the vertical direction of the pixel array 44.

In the pixel array 44, the plurality of pixels 51 is arranged as a two-dimensional array (as a matrix). That is, M×N pixels 51 are arranged in a planar manner. The values of M and N are arbitrary integers.

The plurality of pixels 51 arranged as a two-dimensional array is connected to the vertical scanning circuit 43 with horizontal signal lines 52 on a row basis. In other words, the plurality of pixels 51 arranged in the same row within the pixel array 44 is connected to the vertical scanning circuit 43 with the same single horizontal signal line 52. Note that the horizontal signal line 52 is shown as one wiring line in FIG. 1, but is not limited to one.

In addition, the plurality of pixels 51 arranged as a two-dimensional array is connected to the horizontal scanning circuit 48 with vertical signal lines 53 on a column basis. In other words, the plurality of pixels 51 arranged in the same column within the pixel array 44 is connected to the horizontal scanning circuit 48 with the same single vertical signal line 53.

Each of the pixels 51 within the pixel array 44 outputs a pixel signal that conforms to electric charge accumulated inside to the vertical signal line 53 in accordance with a signal supplied from the vertical scanning circuit 43 via the horizontal signal line 52. The pixel 51 functions as an imaging pixel that outputs a pixel signal of an image of a subject. A detailed configuration of the pixel 51 will be described later with reference to FIG. 2 and the like.

The constant current source circuit unit 45 has a plurality of load metal-oxide semiconductors (MOSs) 54, and one of the load MOSs 54 is connected to one of the vertical signal lines 53. In the load MOS 54, a bias voltage is applied to the gate, the source is grounded, and the load MOS 54 configures a source follower circuit with a transistor within the pixel 51 connected via the vertical signal line 53.

The reference signal generation unit 46 has a digital to analog converter (DAC) 46a, and generates a reference signal having a RAMP waveform in accordance with a clock signal from the timing control unit 42 for supply to the column AD conversion unit 47.

The column AD conversion unit 47 has a plurality of analog to digital converters (ADCs) 55, each being provided as one unit for each column of the pixel array 44. Therefore, the plurality of pixels 51, one of the load MOSs 54, and one of the ADCs 55 are connected to one of the vertical signal lines 53.

The ADC 55 subjects pixel signals supplied from the pixels 51 in the same column via the vertical signal line 53 to correlated double sampling (CDS) processing and further to AD conversion processing.

Each of the ADCs 55 temporarily stores pixel data after AD conversion, and outputs the pixel data to the horizontal output line 49 in accordance with control exerted by the horizontal scanning circuit 48.

The horizontal scanning circuit 48 causes pixel data stored in the plurality of the ADCs 55 to be output to the horizontal output line 49 sequentially at predetermined timings.

The horizontal output line 49 is connected to an output circuit (amplification circuit) 50, and pixel data after AD conversion output from each of the ADCs 55 is output from the output circuit 50 to the outside of the image sensor 41 via the horizontal output line 49. The output circuit 50 (signal processing unit) only performs buffering in some cases, or performs various types of digital signal processing such as black level adjustment and column variation correction, for example, in some cases.

The image sensor 41 configured as described above is a CMOS image sensor called a column AD system in which the ADC 55 that performs CDS processing and AD conversion processing is arranged in each vertical column.

Figure 2:
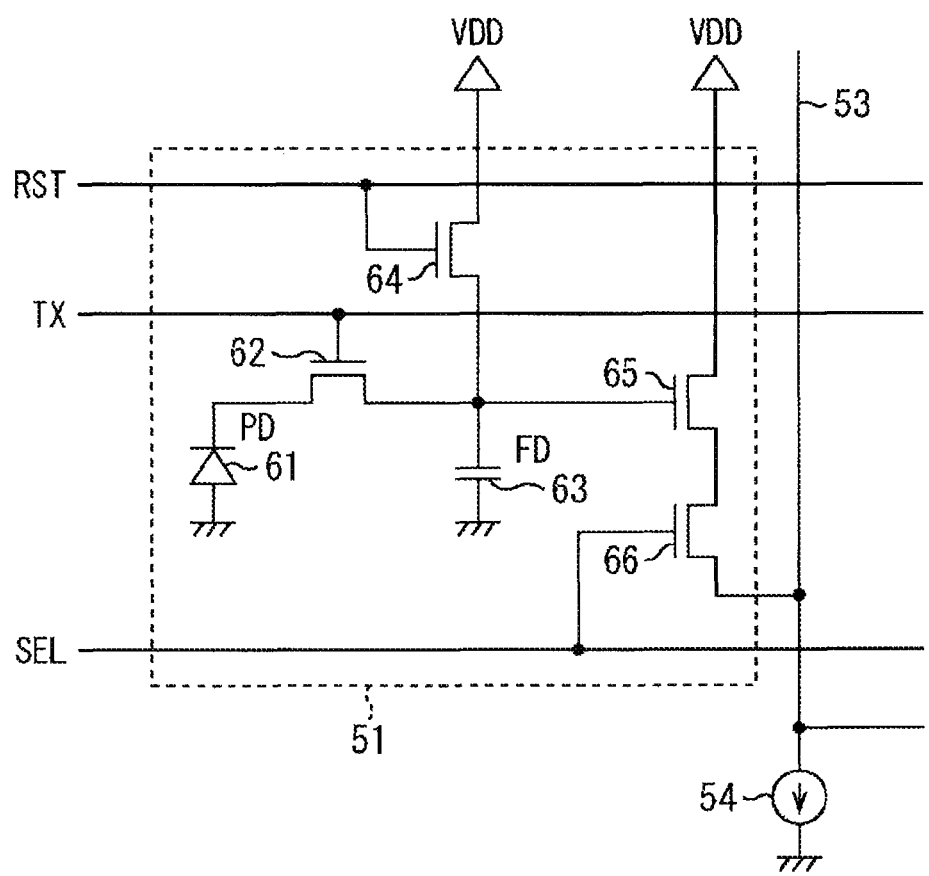
FIG. 2 is a diagram showing an equivalent circuit of a pixel.

FIG. 2 shows an equivalent circuit of the pixel 51. The pixel 51 has a photodiode 61 as a photoelectric conversion element, a transmission transistor 62, floating diffusion (FD: floating diffusion region) 63, a reset transistor 64, an amplification transistor 65, and a selection transistor 66.

The photodiode 61 is a photoelectric conversion unit that generates and accumulates electric charge (signal charge) that conforms to the amount of received light. The photodiode 61 has an anode terminal grounded and a cathode terminal connected to the FD 63 via the transmission transistor 62.

When turned on by a transmission signal TX, the transmission transistor 62 reads out the electric charge generated by the photodiode 61 for transmission to the FD 63.

The FD 63 holds the electric charge read out from the photodiode 61. When turned on by a reset signal RST, the reset transistor 64 resets the potential at the FD 63 with the electric charge accumulated in the FD 63 being discharged to a constant voltage source VDD.

The amplification transistor 65 outputs a pixel signal that conforms to the potential at the FD 63. That is, the amplification transistor 65 configures a source follower circuit with the load MOS 54 as a constant current source, and a pixel signal indicating a level that conforms to the electric charge accumulated in the FD 63 is output from the amplification transistor 65 to the ADC 55 via the selection transistor 66.

When the pixel 51 is selected by a selection signal SEL, the selection transistor 66 is turned on, and outputs the pixel signal of the pixel 51 to the ADC 55 via the vertical signal line 53. The transmission signal TX, the reset signal RST, and the selection signal SEL are supplied from the vertical scanning circuit 43 via the horizontal signal line 52 (FIG. 1).

Figure 3:
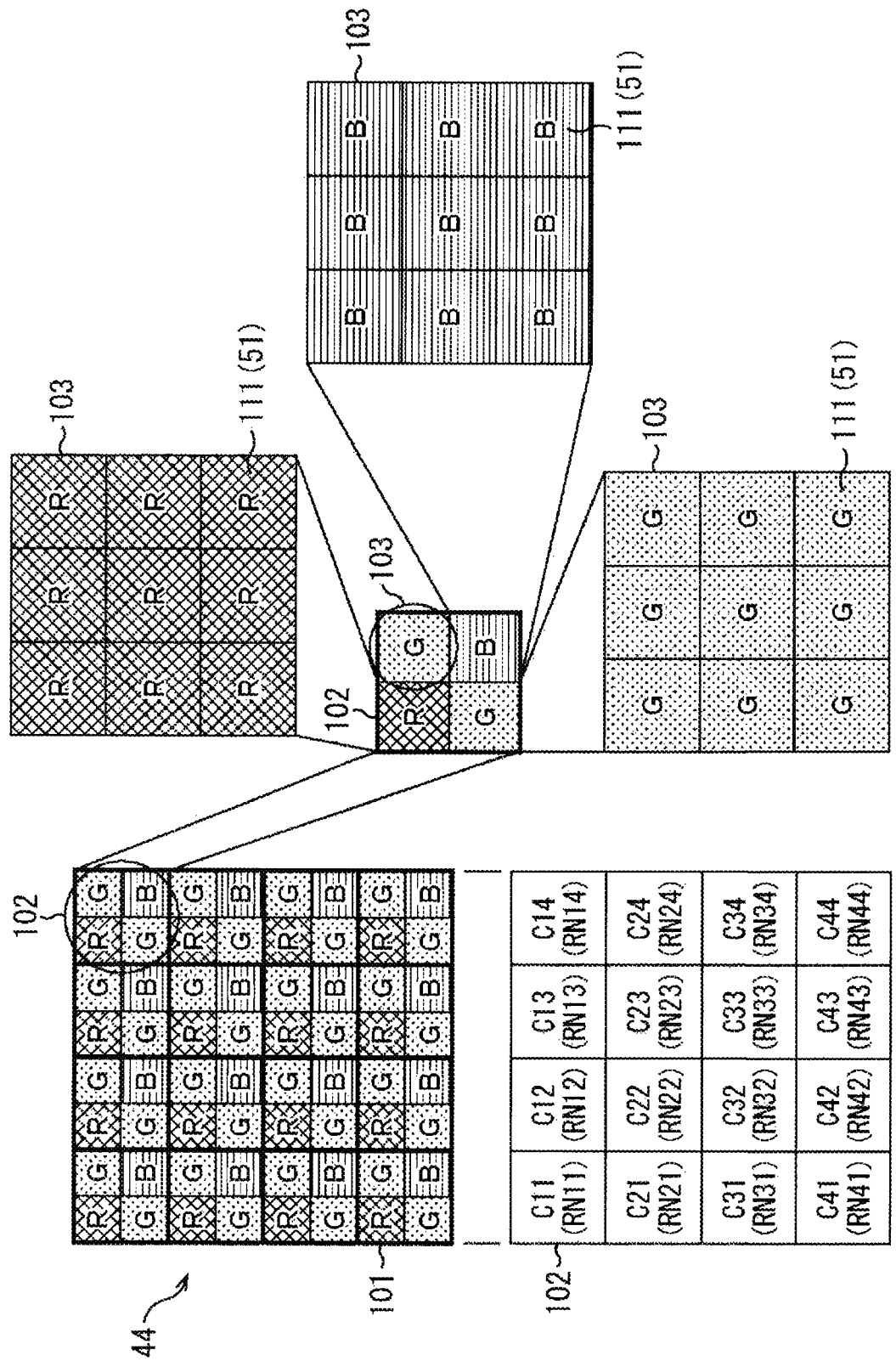
FIG. 3 is a diagram showing a planar configuration example of the first embodiment of the image sensor to which the present technology has been applied.

FIG. 3 is a diagram showing a planar configuration example of an embodiment of the image sensor to which the present technology has been applied. Specifically, FIG. 3 shows an array of the pixels 51. That is, in the present embodiment, the pixel array 44 captures an image of a subject by means of an imaging region 101. The imaging region 101 includes a plurality of blocks 102 arranged as an M/3×N/3 matrix. This block 102 constitutes a unit of an image to be captured. That is, a subject is imaged as a set of units of a predetermined color (a color mixed by red (R), green (G), and blue (B) colors) per block 102, and is displayed (that is, recognized by human eyes).

In the case of this embodiment, the block 102 is configured by arranging subblocks 103 in the Bayer array. That is, the block 102 is configured by arranging four subblocks 103 as a 2×2 matrix, the four subblocks 103 including one red (R) subblock 103, two green (G) subblocks 103, and one blue (B) subblock 103. Note that the color array is not limited to the Bayer array, but may be a stripe array, a checkboard array, an interline array, or the like.

In this example, the green (G) subblocks 103 are arranged at the upper right and the lower left in the block 102, the red (R) subblock 103 is arranged at the upper left, and the blue (B) subblock 103 is arranged at the lower right, respectively. In all the blocks 102, an arrangement pattern of the subblocks 103 is identical. Note that, hereinafter, red (R), green (G), and blue (B) subblocks 103 will be described as an R subblock 103, a G subblock 103, and a B subblock 103, respectively, according to necessity.

Depending on the color mixed by a total of four subblocks 103 of one R subblock 103 at the lower left, two G subblocks 103 at the upper left and the lower right, and one B subblock 103 at the upper right, the color of an image of a subject at a corresponding position is imaged and expressed as an image. That is, as shown in FIG. 3, regions corresponding to the plurality of blocks 102 arranged as an M/3×N/3 matrix shall be assumed as RNij (i and j represent the positions of a row and a column of the block 102). Then, the color of the subject is imaged and expressed as a color Cij per region RNij. That is, the color Cij mixed by the total of four subblocks 103 of the one R subblock 103 at the upper left, the two G subblocks 103 at the lower left and the upper right, and the one B subblock 103 at the lower right constituting that block 102 is imaged as the color of that region RNij of the subject.

Further, in this embodiment, the subblock 103 includes pixels 111 of the same color in a 3×3 matrix adjacent to each other. The pixel 111 corresponds to the pixel 51 in FIGS. 1 and 2. Hereinafter, red (R), green (G), and blue (B) pixels 111 will be described as an R pixel 111, a G pixel 111, and a B pixel 111, respectively, according to necessity. That is, the R subblock 103 includes R pixels 111 in a 3×3 matrix. The G subblock 103 includes G pixels 111 in a 3×3 matrix. The B subblock 103 includes B pixels 111 in a 3×3 matrix. The 3×3 pixels 111 of the same color constituting one subblock 103 can each be read out independently, but can also be read out collectively as one subblock 103.

Figure 4:
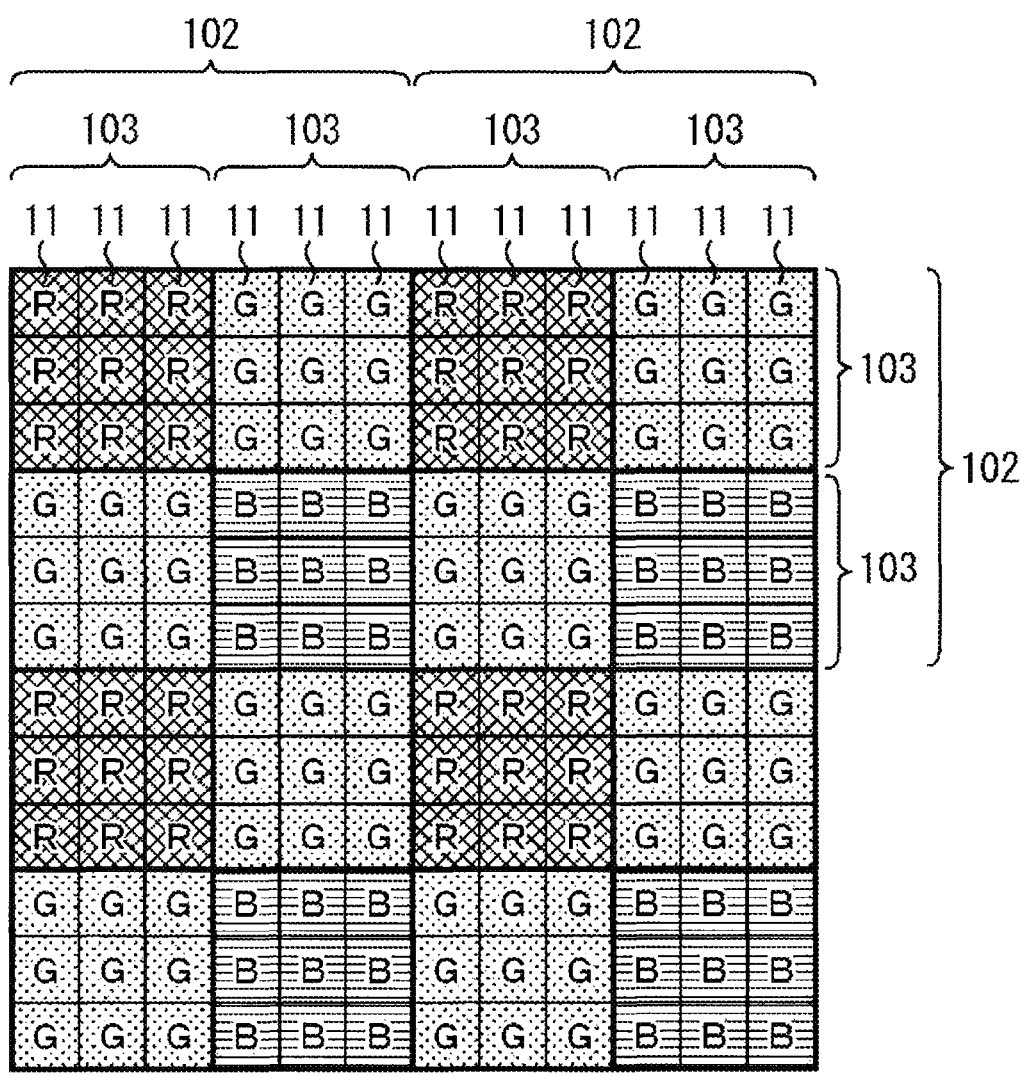
FIG. 4 is a diagram showing a planar configuration example of the first embodiment of the image sensor to which the present technology has been applied.

FIG. 4 is a diagram showing a planar configuration example of an embodiment of the image sensor to which the present technology has been applied. That is, the imaging region 101 in FIG. 3 is expressed by the pixels 111 as shown in FIG. 4. One subblock 103 includes 3×3 pixels 111 of the same color. Specifically, one R subblock 103 includes 3×3 R pixels 111. Similarly, one G subblock 103 includes 3×3 G pixels 111, and one B subblock 103 includes 3×3 B pixels 111.

Then, one block 102 includes 3×3 subblocks 103 (one R subblock 103, two G subblocks 103, and one B subblock 103).

That is, in the imaging region 101, the subblock 103 includes a plurality of pixels 111 of the same color, and the block 102 includes a plurality of subblocks 103 including different colors. Then, the color of an imaging point of a subject at a position corresponding to the block 102 is recognized by people as a mixed color of the block 102 obtained when the different colors of the plurality of subblocks 103 are mixed.

(1-2) Configuration Example of First Embodiment of Electronic Equipment

Figure 5:
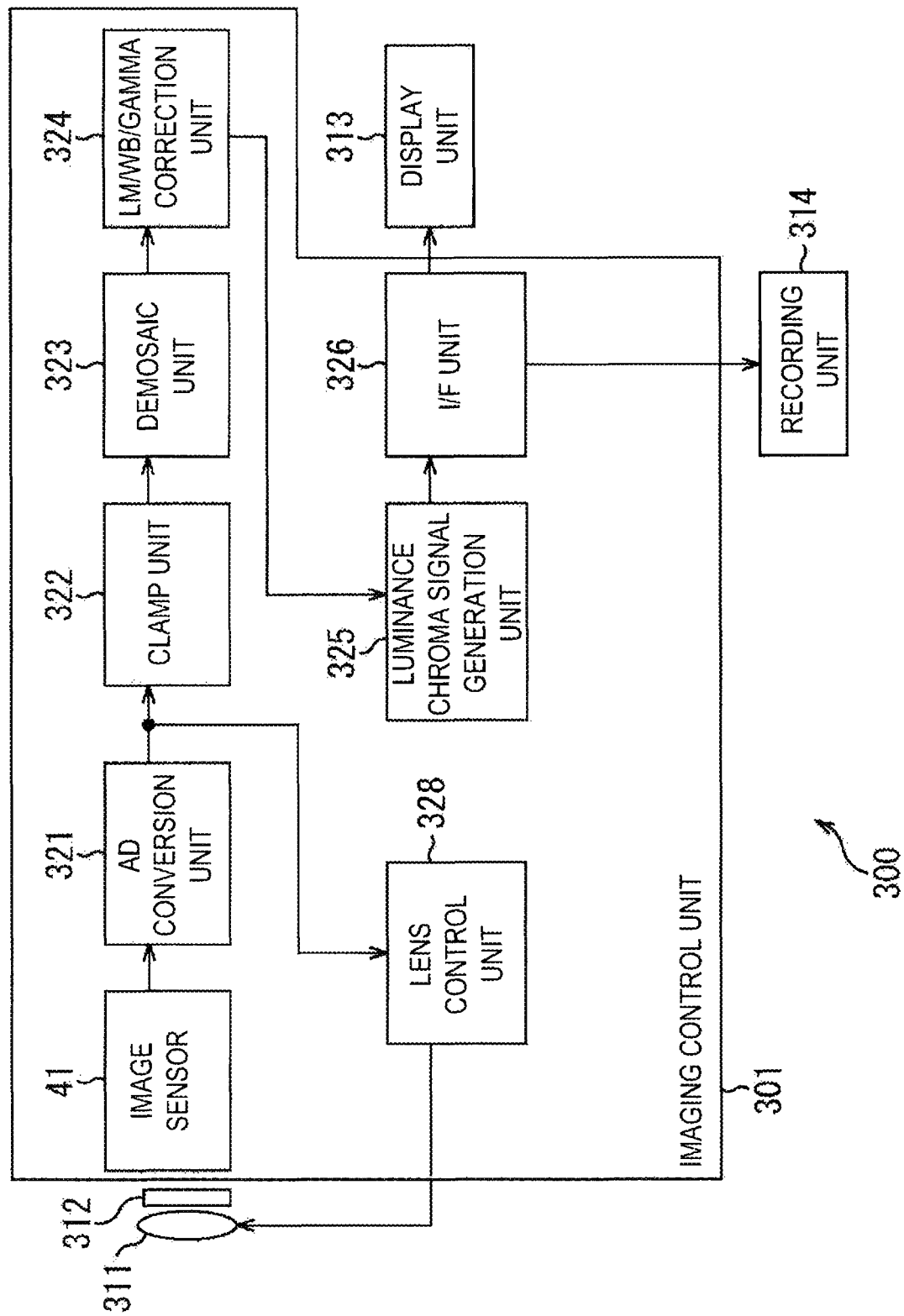
FIG. 5 is a block diagram showing a configuration example of the first embodiment of electronic equipment to which the present technology has been applied.

FIG. 5 is a diagram showing a configuration example of a first embodiment of electronic equipment to which the present technology has been applied. Electronic equipment 300 shown in FIG. 5 is a device that images a subject and outputs an image of the subject as an electric signal. The electronic equipment 300 is configured as, for example, a compact digital camera, a digital single-lens reflex camera, a video camera, a mobile terminal such as a smartphone (multi-function mobile phone) having an imaging function, an endoscope, or the like.

The electronic equipment 300 shown in FIG. 5 has a lens 311, an optical filter 312, an imaging control unit 301, a display unit 313, and a recording unit 314. The imaging control unit 301 has the image sensor 41, an AD conversion unit 321, a clamp unit 322, a demosaic unit 323, a linear matrix (LM)/white balance (WB)/gamma correction unit 324, a luminance chroma signal generation unit 325, an interface (I/F) unit 326, and a lens control unit 328. In this example, the display unit 313 and the recording unit 314 are provided outside the imaging control unit 301, but can also be provided inside.

The lens 311 adjusts the focal length of subject light incident on the image sensor 41. An aperture (not shown) that adjusts the amount of light of subject light incident on the image sensor 41 is provided in a later stage of the lens 311. A specific configuration of the lens 311 is arbitrary, and the lens 311 may include a plurality of lenses, for example.

Subject light transmitted through the lens 311 is incident on the image sensor 41 through the optical filter 312 configured as an IR cut filter or the like that cuts infrared light and transmits light other than infrared light, for example.

The image sensor 41 includes a plurality of pixels 111 having photoelectric conversion elements such as photodiodes that photoelectrically convert subject light. Each of the pixels 111 converts the subject light into an electric signal, and supplies the electric signal to the AD conversion unit 321.

Note that the image sensor 41 constitutes a solid state image sensor of the present technology. This solid state image sensor may be configured as a single chip module, or the image sensor 41 and a signal processing circuit may be configured as separate chips.

The image sensor 41 of the present technology may be, for example, a CCD image sensor that performs transfer using a circuit element called a charge coupled device (CCD) for reading out electric charge produced by the photoelectric conversion element on the basis of subject light, or may be a CMOS image sensor or the like having an amplifier per unit cell in which a complementary metal oxide semiconductor (CMOS) is used.

The AD conversion unit 321 converts RGB electric signals (analog signals) supplied from the image sensor 41 into digital data (image data). The AD conversion unit 321 supplies image data (RAW data) of the digital data to the clamp unit 322 and the lens control unit 328.

The clamp unit 322 subtracts a black level which is a pixel value of the image non-output region and which is a level determined as black from the image data.

Figure 6:
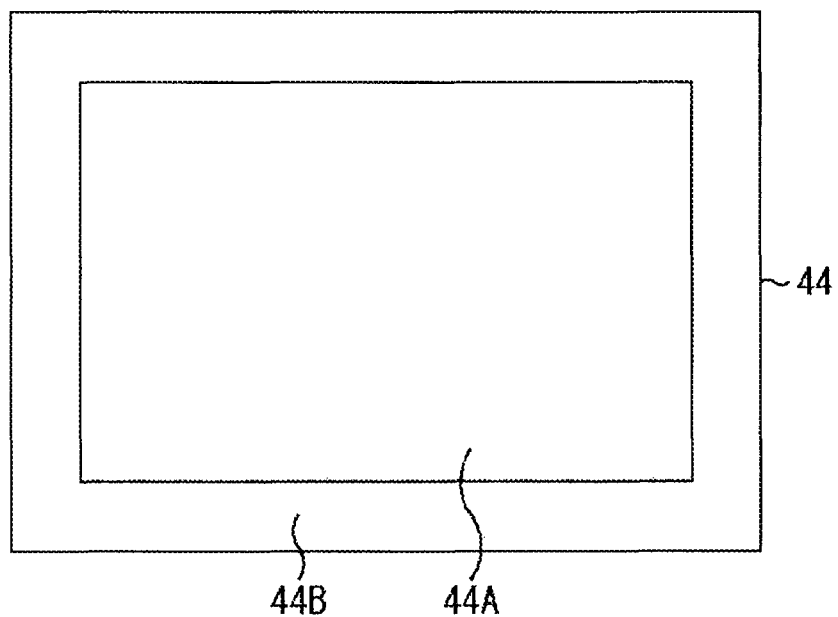
FIG. 6 is a diagram showing an image output region and an image non-output region of the image sensor.

Here, the image output region and image non-output region will be described with reference to FIG. 6. FIG. 6 is a diagram showing the image output region and image non-output region to which the present technology has been applied. As shown in FIG. 6, the pixel array 44 is provided with an image output region 44A substantially at the center and an image non-output region 44B around the image output region 44A. The image output region 44A is an effective pixel region, and outputs of the pixels 111 in the image output region 44A are utilized as image data. On the other hand, since the image non-output region 44B is external to the effective pixel region, outputs of the pixels 111 in the image non-output region 44B are not utilized as image data. However, an optical black (OPB) region is set for the pixels 111 in the image non-output region 44B, and outputs of the pixels 111 in the OPB region have the black level which is a level determined as black.

The clamp unit 322 supplies image data of all the pixels from which the black levels as outputs of the pixels 111 in the OPB region have been subtracted to the demosaic unit 323.

The lens control unit 328 controls driving of the lens 311. Specifically, the lens control unit 328 calculates the driven amount of the lens 311 in accordance with a focus determination result based on a focus determination by means of contrast auto focus or the like through use of image data from the AD conversion unit 321, and moves the lens 311 in accordance with the calculated driven amount.

The demosaic unit 323 subjects RAW data from the AD conversion unit 321 to demosaic processing, and performs color information complementing or the like for conversion into RGB data. The demosaic unit 323 supplies the image data (RGB data) after the demosaic processing to the LM/WB/gamma correction unit 324.

The LM/WB/gamma correction unit 324 subjects the RGB data from the demosaic unit 323 to correction of color properties. Specifically, the LM/WB/gamma correction unit 324 performs processing of correcting each color signal of image data using a matrix coefficient in order to fill the difference between chromaticity points of primary colors (RGB) defined by the standard and chromaticity points of an actual camera to change color reproduction. In addition, the LM/WB/gamma correction unit 324 adjusts white balance by setting a gain for white for the value of each channel of the RGB data. Further, the LM/WB/gamma correction unit 324 performs gamma correction for modulating a relative relation between the color of image data and output device properties to obtain a display closer to an original. The LM/WB/gamma correction unit 324 supplies the image data (RGB data) after the correction to the luminance chroma signal generation unit 325.

The luminance chroma signal generation unit 325 generates a luminance signal (Y) and a color difference signal (Cr, Cb) from the RGB data supplied from the LM/WB/gamma correction unit 324. Upon generating a luminance chroma signal (Y, Cr, Cb), the luminance chroma signal generation unit 325 supplies the luminance signal and the color difference signal to the I/F unit 326.

The I/F unit 326 supplies the supplied image data (luminance chroma signal) to the recording unit 314 such as a recording device that records image data for recording, or outputs the supplied image data to the display unit 313 such as a display device that displays an image of the image data for display.

(1-3) Imaging Processing Performed by Electronic Equipment in FIG. 5

Figure 7:
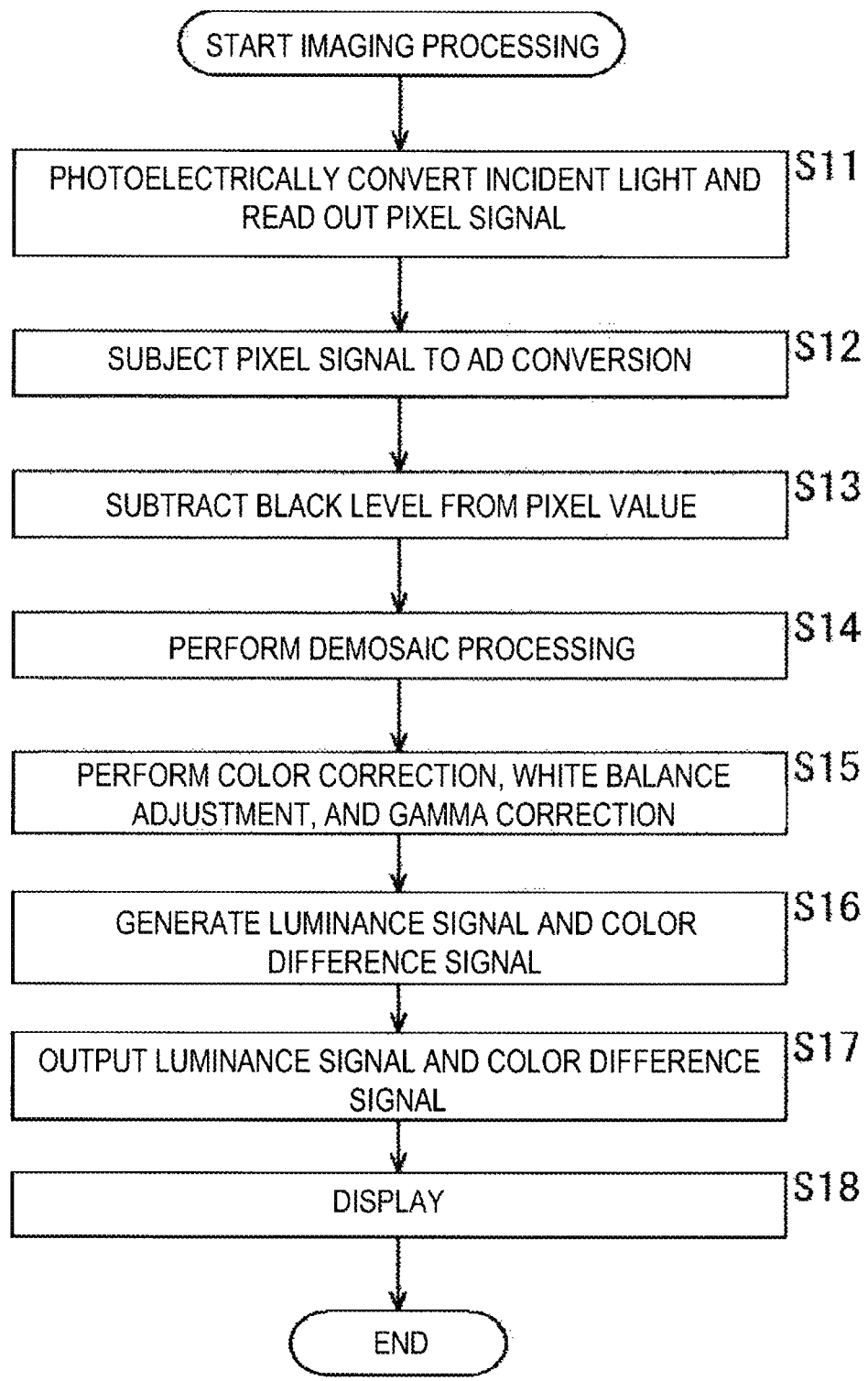
FIG. 7 is a flowchart describing imaging processing performed by the electronic equipment of FIG. 5.

Next, imaging processing performed by the electronic equipment 300 in FIG. 5 will be described with reference to a flowchart of FIG. 7. FIG. 7 is a flowchart describing imaging processing performed by the electronic equipment to which the present technology has been applied.

First, in step S11, the image sensor 41 photoelectrically converts incident light on each of the pixels 111, and reads out the pixel signal for supply to the AD conversion unit 321.

In step S12, the AD conversion unit 321 subjects each pixel signal from the image sensor 41 to AD conversion for supply to the clamp unit 322.

In step S13, the clamp unit 322 subtracts the black level sensed in the optical black (OPB) region provided outside the effective pixel region from each pixel signal (pixel value) from the AD conversion unit 321. The clamp unit 322 supplies image data (pixel values) of all the pixels from which the black levels have been subtracted to the demosaic unit 323.

In step S14, the demosaic unit 323 performs demosaic processing to convert RAW data into RGB data for supply to the LM/WB/gamma correction unit 324.

In step S15, the LM/WB/gamma correction unit 324 subjects the RGB data from the demosaic unit 324 to color correction, white balance adjustment, and gamma correction for supply to the luminance chroma signal generation unit 325.

In step S16, the luminance chroma signal generation unit 325 generates a luminance signal and a color difference signal (that is, YCrCb data) from the RGB data.

Then, in step S17, the I/F unit 326 outputs the luminance signal and the color difference signal generated by the luminance chroma signal generation unit 325 to the recording unit 314 and the display unit 313.

In step S18, the display unit 313 displays an image of a subject on the basis of the signals supplied from the I/F unit 326. In addition, the recording unit 314 records the signals supplied from the I/F unit 326 on the basis of an instruction made by a user.

According to the above processing, the color of an imaging point of a subject at a position corresponding to the block 102 can be recognized by people as a mixed color of the block 102 obtained when different colors are mixed on the subblock 103 basis including a plurality of 3×3 pixels 111 of the same color.

2. Second Embodiment (2-1) Simultaneous Imaging of High Frame Rate Imaging and Normal Frame Rate Imaging The example in which the pixels 111 of the same color in a 3×3 matrix adjacent to each other constituting the subblock 103 all have an identical exposure duration has been described above, but all the pixels 111 constituting the subblock 103 may not be identical in exposure duration.

Figure 8:
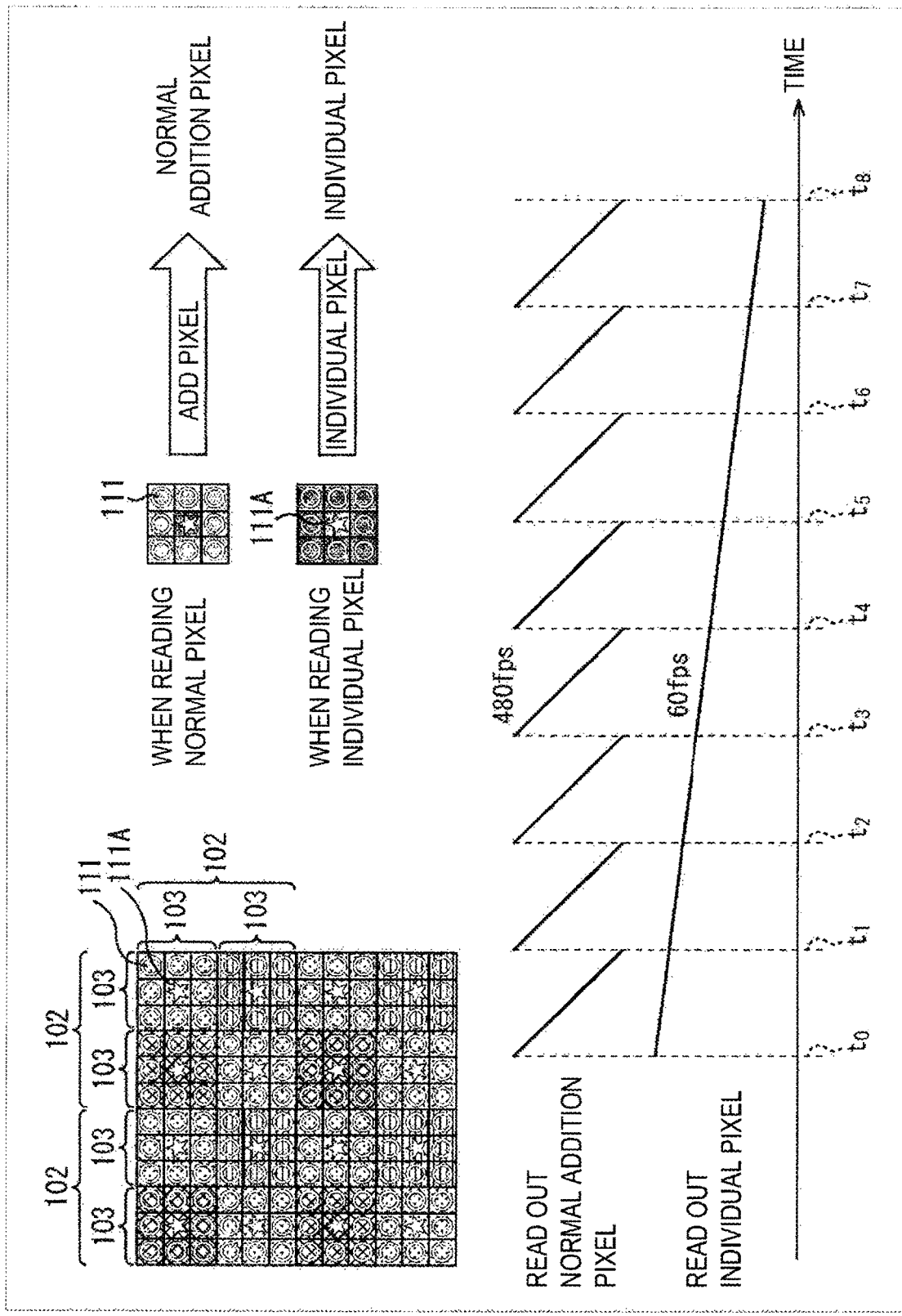
FIG. 8 is a diagram describing an example of achieving simultaneous imaging of high frame rate imaging and normal frame rate imaging.

For example, as shown at the upper left part of FIG. 8, among the pixels 111 of the same color in a 3×3 matrix, only a pixel at the central position in the subblock 103 indicated by a white star mark may be an individual pixel 111A, and the remaining eight pixels 111 may be read out as normal pixels. At this time, as further shown at the upper right part, pixel signals read out from the eight normal pixels 111 may be added to be used as a pixel signal of one pixel.

Hereinafter, when adding pixel values read out from the eight normal pixels 111 in each of the subblocks 103 to be treated as one pixel, the normal pixels 111 will be called normal addition pixels as well.

In such a manner, in the example at the upper left part of FIG. 8, in a case where the exposure duration (≈frame rate) of the individual pixel 111A has a length eight times that of the normal pixels 111, for example, the normal addition pixels can be treated as pixels having a sensitivity eight times that of the normal pixels 111.

Note that, since the pixel signal shall be treated on the subblock 103 basis, pixel signals of the normal addition pixels and a pixel signal of the individual pixel 111A will exist in the identical subblock 103 in this example.

As a result, as shown at the lower part of FIG. 8, in a case where the individual pixel 111A is used at a frame rate of 60 fps, for example, the normal addition pixels can ensure a sensitivity equivalent to that of the individual pixel 111A even if the frame rate is set at 480 fps.

Note that the upper stage at the lower part of FIG. 8 shows timings of reading out the normal addition pixels, and respective exposure start times and exposure finish times are shown. In addition, the lower stage at the lower part of FIG. 8 shows timings of reading out the individual pixel 111A, and shows an exposure start time and an exposure finish time.

More specifically, in the first frame of normal addition pixels, exposure is started at time t0, and exposure finishes at time t1. Similarly, in the second frame of normal addition pixels, exposure is started at time t1, and exposure finishes at time t2. In the third frame of normal addition pixels, exposure is started at time t2, and exposure finishes at time t3. In the fourth frame of normal addition pixels, exposure is started at time t3, and exposure finishes at time t4. In the fifth frame of normal addition pixels, exposure is started at time t4, and exposure finishes at time t5. In the sixth frame of normal addition pixels, exposure is started at time t5, and exposure finishes at time t6. In the seventh frame of normal addition pixels, exposure is started at time t6, and exposure finishes at time t7. In the eighth frame of normal addition pixels, exposure is started at time t7, and exposure finishes at time t8. Note that time t1 to t2, time t2 to t3, time t3 to t4, time t4 to t5, time t5 to t6, time t6 to t7, and time t7 to t8 are all identical time durations.

In contrast, in the first frame of the individual pixel 111A, exposure is started at time t0, and exposure finishes at time t8.

That is, since the sensitivity is eight times that of the individual pixel 111A, the normal addition pixels can achieve imaging with an identical sensitivity at a frame rate eight times that of the individual pixel 111A.

As a result, high frame rate imaging and normal frame rate imaging can be achieved at the same time.

(2-2) Dynamic Range Enlargement Imaging

In addition, since the normal addition pixels including an addition result of pixel values of eight pixels 111 have a sensitivity eight times that of the individual pixel 111A, imaging called high dynamic range (HDR) imaging, in which the dynamic range is enlarged using pixels different in sensitivity, can be achieved in a case where the normal addition pixels and the individual pixel 111A are identical in exposure duration.

Figure 9:
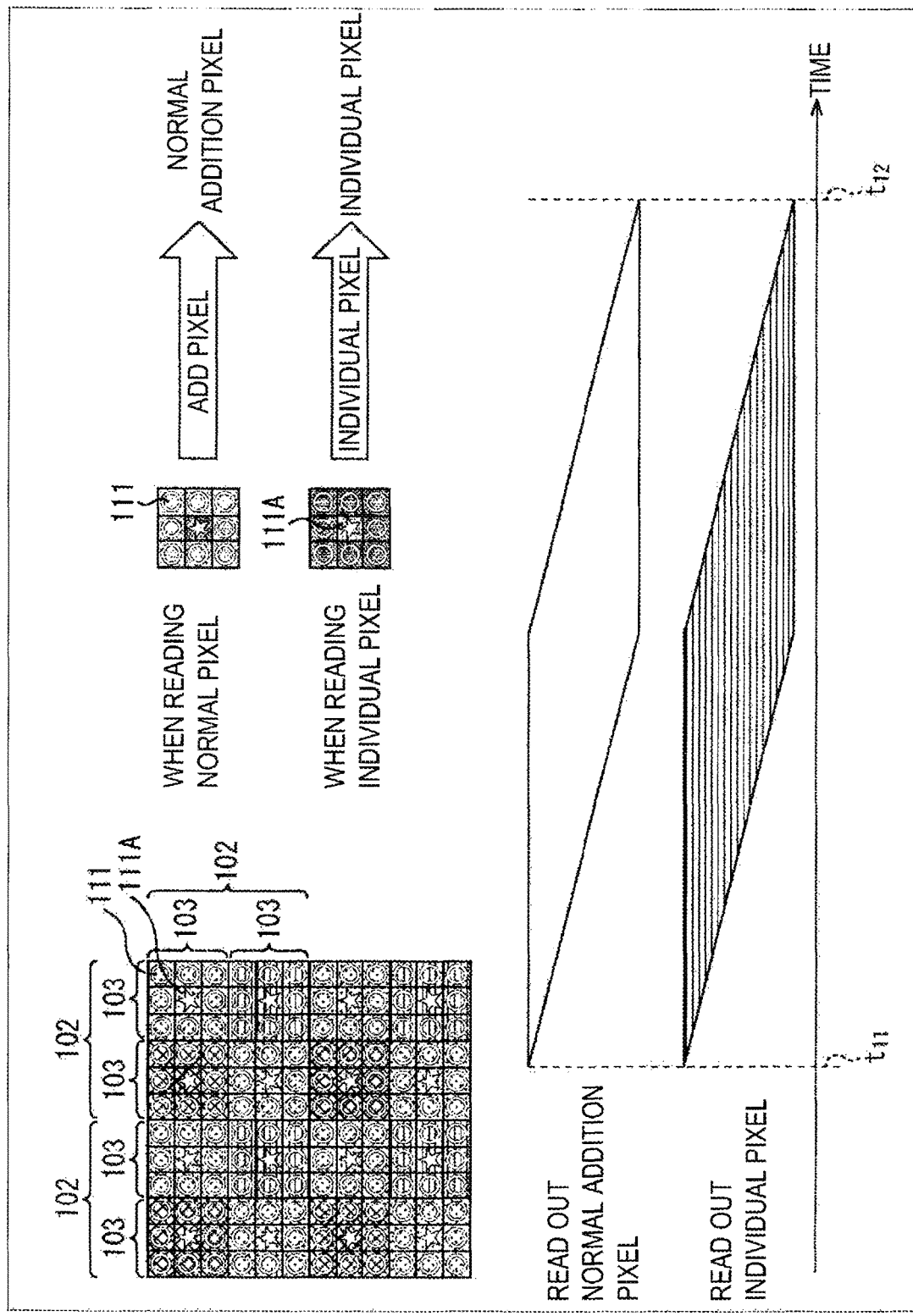
FIG. 9 is a diagram describing an example of achieving dynamic range enlargement imaging.

Note that the upper left part and the upper right part of FIG. 9 are similar to those of FIG. 8. In addition, at the lower part of FIG. 9, the upper stage shows normal addition pixels, and an exposure start time and an exposure finish time of the individual pixel 111A are shown in the lower stage, and it is shown that exposure is started at time t11 and exposure finishes at time t12 both in the normal addition pixels and the individual pixel 111A.

In general, HDR imaging is achieved by changing the exposure duration per pixel. However, since the timing of being exposed is different on a pixel basis in the case of general HDR imaging, pixel signals in which subjects different from each other appear will be obtained between pixels different in exposure duration when there is a motion of a subject, so that a motion blur occurs, and the image quality is reduced.

In contrast, as shown in FIG. 9, HDR imaging can be achieved using pixel signals exposed at an identical timing, using the normal addition pixels and the individual pixel 111A different in sensitivity. That is, even if there is a motion of a subject, subjects substantially identical to each other will appear in the normal addition pixels and the individual pixel 111A within an identical exposure duration, so that a motion blur can also be reduced in HDR imaging.

(2-3) Configuration Example of Second Embodiment of Electronic Equipment

Next, a configuration example of a second embodiment of the electronic equipment 300 will be described with reference to the block diagram of FIG. 10.

Figure 10:
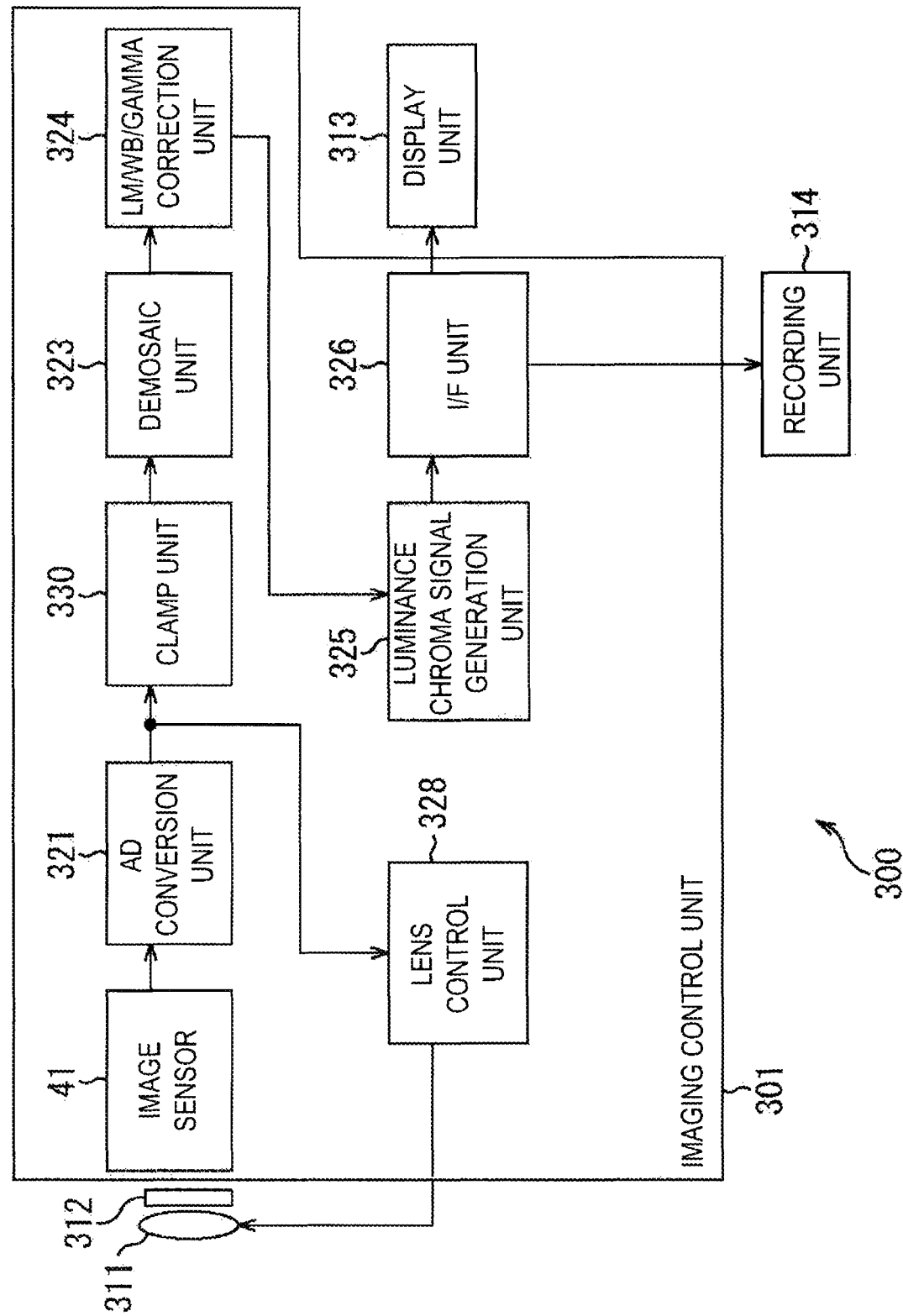
FIG. 10 is a block diagram showing a configuration example of a second embodiment of electronic equipment to which the present technology has been applied.

In the electronic equipment 300 in FIG. 10, components having functions identical to those of the electronic equipment 300 in FIG. 4 are denoted by identical reference characters and identical names, and the description will be omitted as appropriate. The electronic equipment 300 in FIG. 10 is different from the electronic equipment 300 in FIG. 5 in that a clamp unit 330 is provided instead of the clamp unit 322.

The clamp unit 330 has basic functions similar to those of the clamp unit 322, and further, adds digital signals of pixel signals supplied from the normal pixels 111, treats normal addition pixels as a pixel signal of one pixel on the subblock 103 basis, and for the individual pixel 111A, treats a pixel signal as it is as a pixel signal of one pixel of the subblock 103 at an identical position.

(2-4) Imaging Processing Performed by Electronic Equipment in FIG. 10

Figure 11:
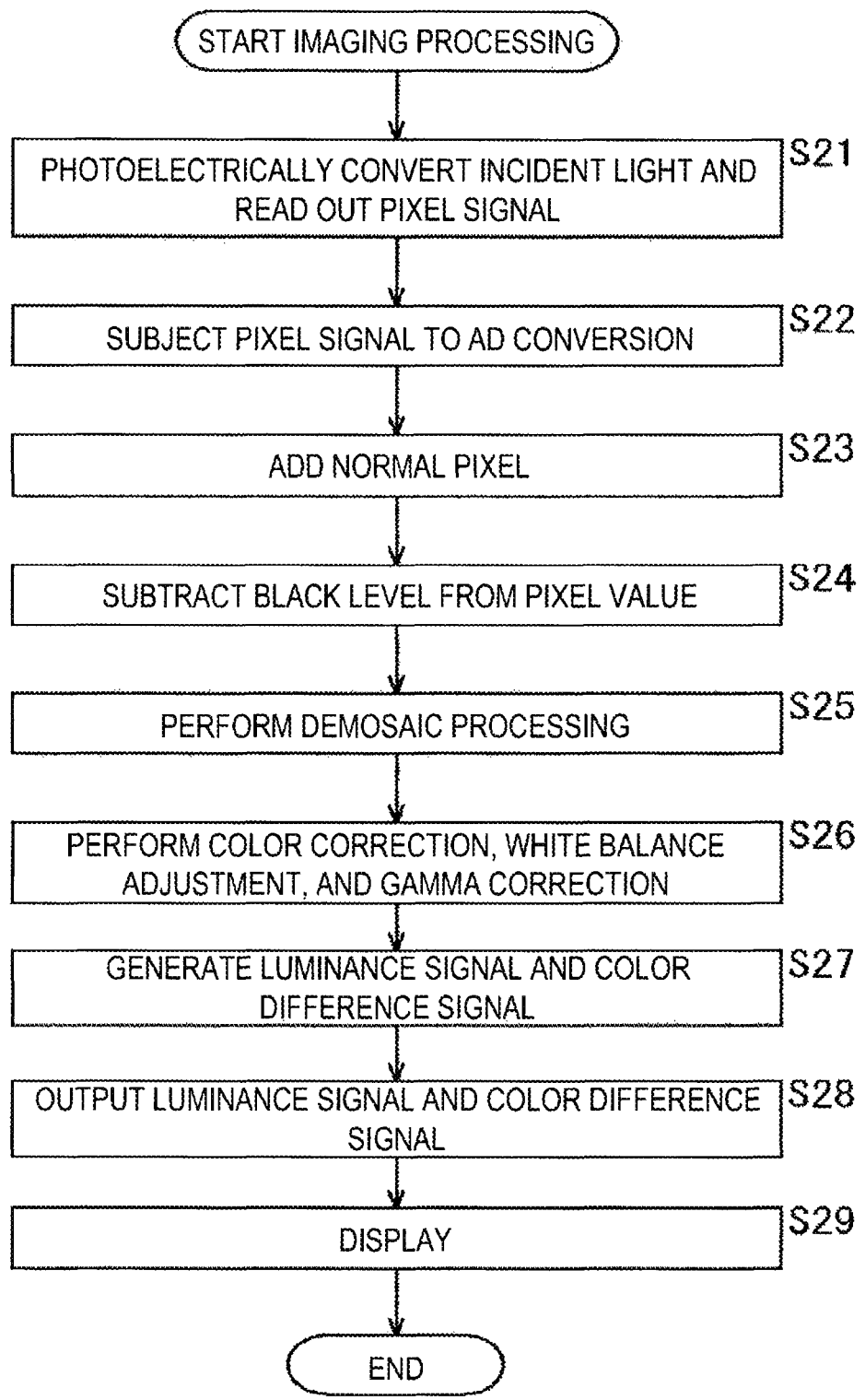
FIG. 11 is a flowchart describing imaging processing performed by the electronic equipment of FIG. 10 that achieves simultaneous imaging of high frame rate imaging and normal frame rate imaging as well as dynamic range enlargement imaging.

Next, imaging processing through use of normal addition pixels performed by the electronic equipment 300 in FIG. 10 will be described with reference to a flowchart of FIG. 11. Note that, since processing in steps S21, S22, and S24 to S29 in the flowchart of FIG. 10 is processing identical to that of steps S11 to S18 in the flowchart of FIG. 7, the description will be omitted. However, the processing in steps S21 and S22 is processing performed in each of eight pixels 111 constituting the normal addition pixels.

That is, in step S23, the clamp unit 330 adds eight pixel values constituting normal addition pixels for each pixel signal (pixel value) from the AD conversion unit 321, and hereinafter, executes signal processing as one normal addition pixel on the subblock 103 basis.

Note that, since imaging processing through use of the individual pixel 111A is similar to the processing described with reference to the flowchart of FIG. 7, the description will be omitted.

In the above manner, by providing the normal addition pixels and the individual pixel 111A different in sensitivity on the subblock 103 basis, images with an identical sensitivity can be captured even if the normal addition pixels and the individual pixel 111A are different in exposure duration, so that imaging at a high frame rate with an identical sensitivity and imaging at a normal frame rate, for example, can be achieved at the same time.

That is, when the normal addition pixels have a sensitivity eight times the sensitivity of the individual pixel 111A as shown in FIG. 8, images with an identical sensitivity can be captured even if imaging is performed with the normal addition pixels at a frame rate eight times that of the individual pixel 111A (in a ⅛ exposure duration). As a result, imaging at different frame rates can be achieved at the same time.

In addition, since images with different sensitivities can be captured at the same time when the respective exposure durations of the normal addition pixels and the individual pixel 111A are made identical, high image quality HDR imaging with less motion blur can be achieved.

That is, as shown in FIG. 9, when the normal addition pixels have a sensitivity eight times the sensitivity of the individual pixel 111A, images with a sensitivity eight times the sensitivity of the individual pixel 111A can be captured in an identical exposure duration by means of the normal addition pixels. As a result, high image quality HDR imaging with less motion blur can be achieved.

Further, a configuration that processes pixel signals of the normal addition pixels and a configuration that processes a pixel signal of the individual pixel 111 may be each independent. That is, two systems of a configuration that processes pixel signals of the normal addition pixels and a configuration that processes a pixel signal of the individual pixel 111 may be each independently provided for the clamp unit 330, the demosaic unit 323, the LM/WB/gamma correction unit 324, the luminance chroma signal generation unit 325, and the interface unit 326, for example.

3. Third Embodiment (3-1) Pixel Arrangement Example Including Normal Addition Pixels and Phase Difference Detection Pixel The pixel arrangement example in which normal addition pixels and an individual pixel different in sensitivity are provided on the subblock 103 basis has been described above, but phase difference detection pixels may be provided on the subblock 103 basis instead of the normal addition pixels and individual pixel.

Figure 12:
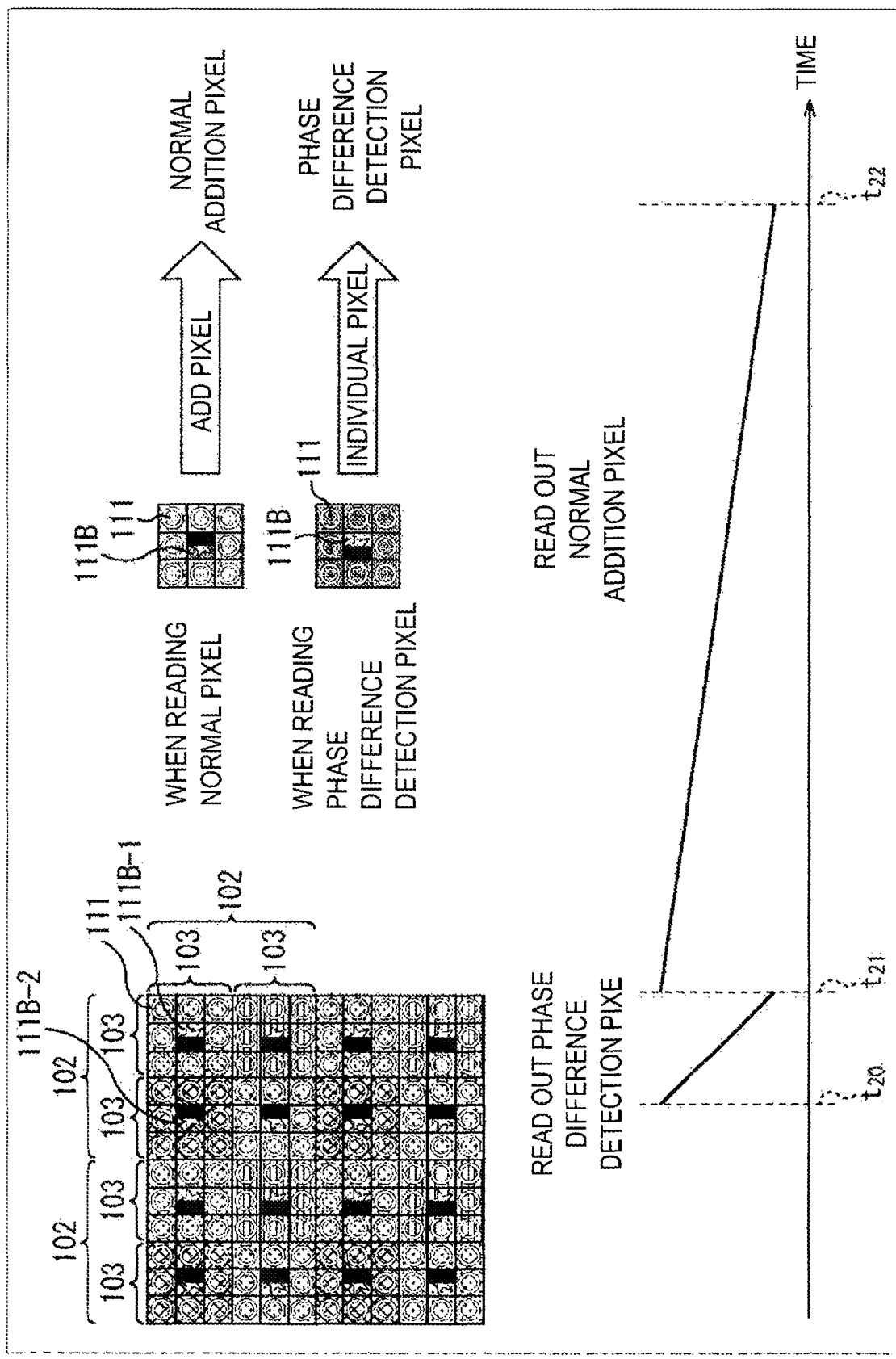
FIG. 12 is a diagram describing a pixel arrangement example in which a phase difference detection pixel is provided instead of an individual pixel.

For example, as shown in FIG. 12, m×n pixels 111 are basically R, G, and B imaging pixels, but a pixel at the central position in the horizontal direction and at the central position in the vertical direction among three pixels in the horizontal direction×three pixels in the vertical direction constituting the subblock 103 has been replaced by either of paired phase difference detection pixels 111B-1 and 111B-2. With such a configuration, either the phase difference detection pixel 111B-1 or 111B-2 is arranged regularly as a whole. In the configuration example of FIG. 5, a plurality of phase difference detection pixels 111B-1 or 111B-2 in which the half of the pixel is indicated by a black rectangle, and the remaining half is indicated by a white star mark is arranged in a scattered manner in the plurality of pixels 111 arranged two-dimensionally as a matrix.

In more detail, in each of the B subblocks 103 and the R subblocks 103, the central pixel 111 at relatively the same position (corresponding position) among the 3×3 pixels 111 is the phase difference detection pixel 111B-1 or 111B-2.

Then, of the paired phase difference detection pixels 111B-1 and 111B-2 that detect a phase difference in the lateral direction, the phase difference detection pixel 111B-1 constituting one of the pair is arranged in the second and eighth columns from the right. In addition, the phase difference detection pixel 111B-2 constituting the other of the pair that detect a phase difference in the lateral direction is arranged in the fifth and eleventh columns from the right.

Figure 13:
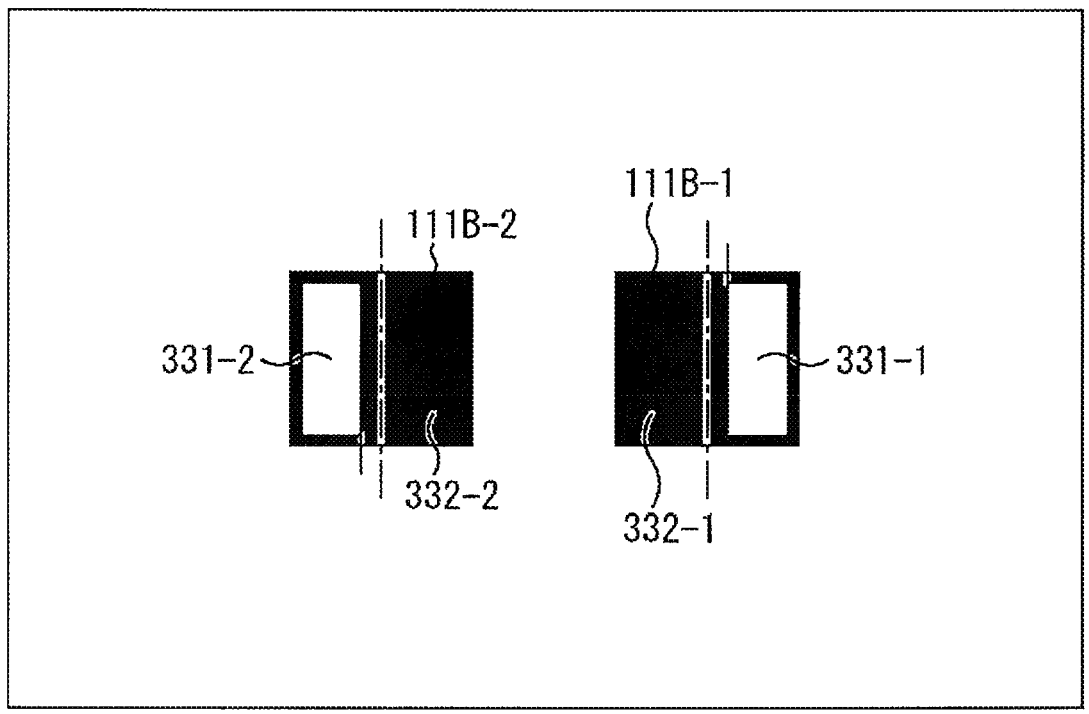
FIG. 13 is a diagram showing a configuration of phase difference detection pixels of an embodiment of the image sensor to which the present technology has been applied.

FIG. 13 is a diagram showing a configuration of the phase difference detection pixels 111B-1 and 11B-2 in the pixel array 44 of the image sensor 41 to which the present technology has been applied. On the left side in FIG. 13, the phase difference detection pixel 111B-2 of the paired phase difference detection pixels 111B-1 and 111B-2 that detect a phase difference in the lateral direction is shown. In the phase difference detection pixel 111B-2, the light shielding part 332-2 is formed on the right side, and the light transmitting part 331-2 is formed on the left side. In this example, the light shielding part 332-2 that shields light directed from a subject to the photodiode 61 includes a film of metal such as copper, for example. Then, the light transmitting part 331-2 that transmits light from the subject to the photodiode 61 is formed by opening part of the metal film that forms the light shielding part 332-2. Of course, an opening can also be formed by not forming the light shielding part 332-2.

On the other hand, in the phase difference detection pixel 111B-1 illustrated in the right side of FIG. 13 which makes a pair with the phase difference detection pixel 111B-2, the light shielding part 332-1 is formed on the left side, and the light transmitting part 331-1 is formed on the right side. In this example, the light shielding part 332-1 that shields light directed from a subject to the photodiode 61 also includes a film of metal such as copper, for example, and the light transmitting part 331-1 that transmits light from the subject to the photodiode 61 is formed by opening part of the metal film that forms the light shielding part 332-1. Of course, an opening can also be formed by not forming the light shielding part 332-1.

Although FIG. 13 shows the example in which the phase difference detection pixels 111B that detect a phase difference in the lateral direction (horizontal direction) are provided, a phase difference in the vertical direction may be detected.

Figure 14:
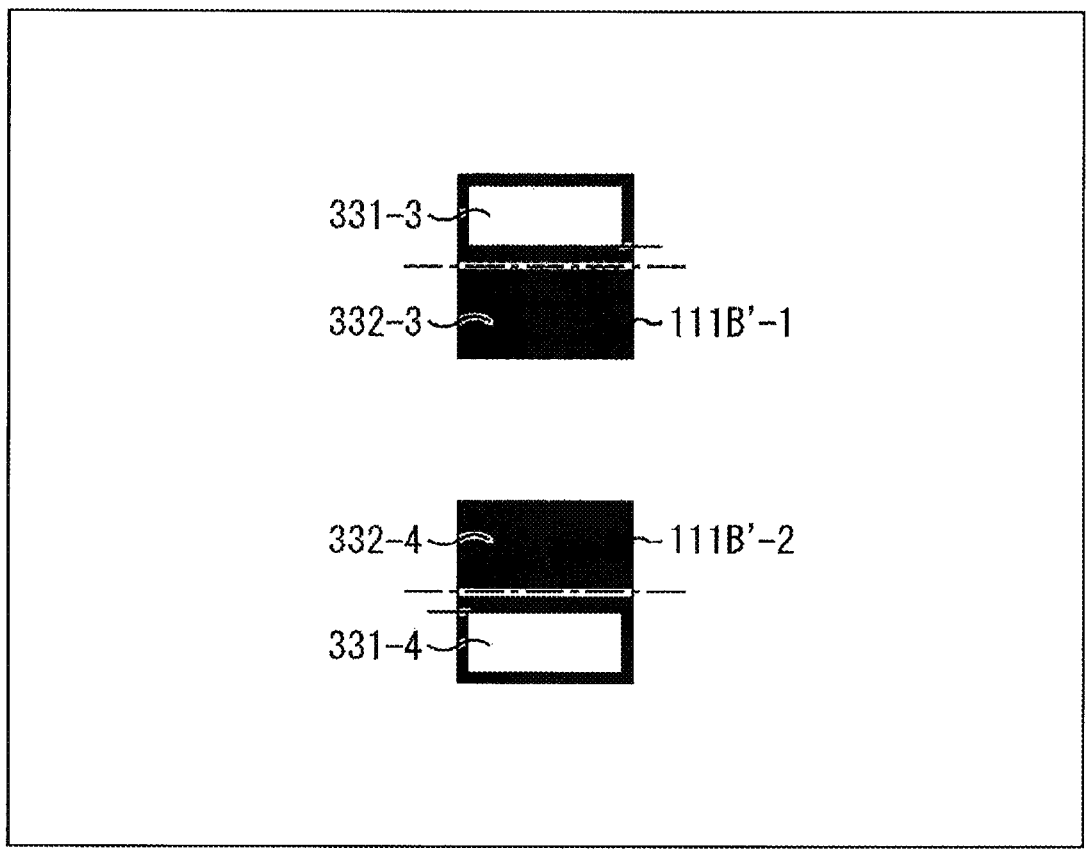
FIG. 14 is a diagram showing a configuration of phase difference detection pixels of an embodiment of the image sensor to which the present technology has been applied.

Further, on the upper side in FIG. 14, the phase difference detection pixel 111B'-1 of the paired phase difference detection pixels 111B'-1 and 111B'-2 that detect a phase difference in the vertical direction is shown. In the phase difference detection pixel 111B'-1, the light shielding part 332-3 is formed on the lower side, and the light transmitting part 331-3 is formed on the upper side. In this example, the light shielding part 332-3 that shields light directed from a subject to the photodiode 61 includes a film of metal such as copper, for example. Then, the light transmitting part 331-3 that transmits light from the subject to the photodiode 61 is formed by opening part of the metal film that forms the light shielding part 332-4. Of course, an opening can also be formed by not forming the light shielding part 332-3.

On the other hand, in the phase difference detection pixel 111B'-2 illustrated in the lower side of FIG. 14 which makes a pair with the phase difference detection pixel 111B'T-1, the light shielding part 332-4 is formed on the upper side, and the light transmitting part 331-4 is formed on the lower side. In this example, the light shielding part 332-4 that shields light directed from a subject to the photodiode 61 also includes a film of metal such as copper, for example, and the light transmitting part 331-4 that transmits light from the subject to the photodiode 61 is formed by opening part of the metal film that forms the light shielding part 332-4. Of course, an opening can also be formed by not forming the light shielding part 332-4.

(3-2) Principle of Phase Difference Detection

Figure 15:
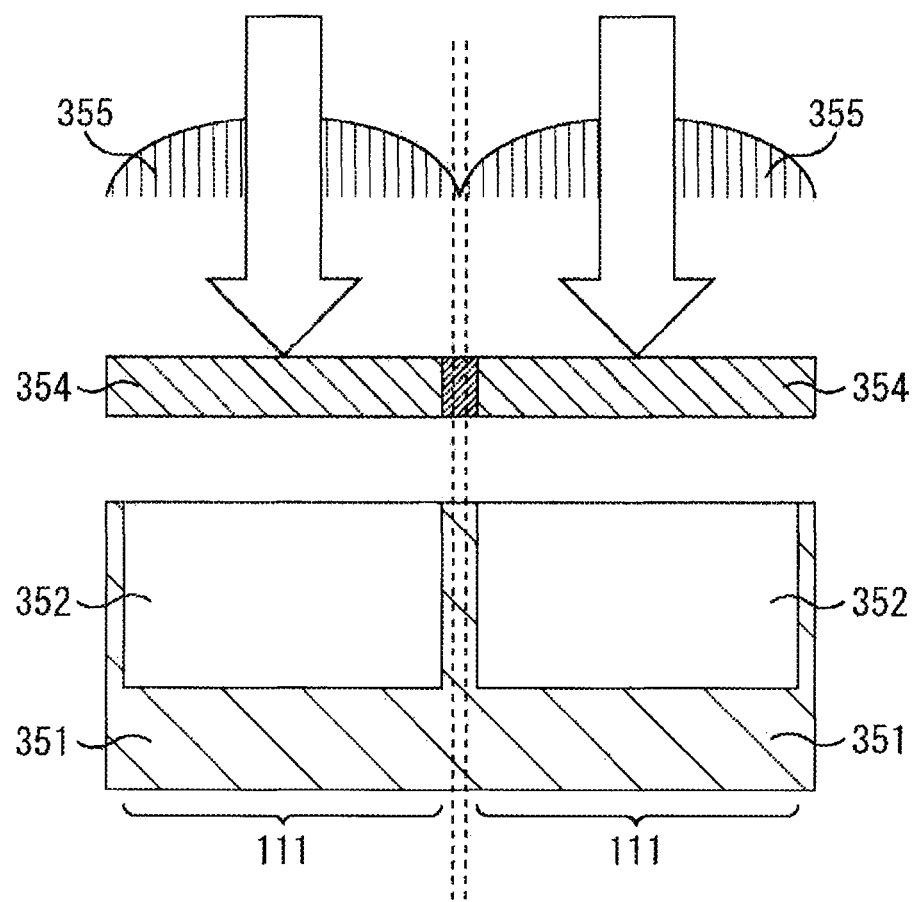
FIG. 15 is a sectional view showing a configuration example of normal pixels of an embodiment of the image sensor to which the present technology has been applied.

FIG. 15 is a sectional view showing a configuration example of the normal pixels 111 of an embodiment of the image sensor to which the present technology has been applied. FIG. 15 represents a sectional configuration of two pixels 111 among pixels constituting normal addition pixels. As shown in FIG. 15, in the pixels 111, a photodiode 352 (corresponding to the photodiode 61 of FIG. 2) as a photoelectric conversion unit is formed in a semiconductor substrate 351 of silicon (Si), for example. An R, G, or B color filter 354 is formed in a layer above the semiconductor substrate 351, and an on-chip lens 355 is formed in a layer above them.

Light from a subject is collected by the on-chip lens 355, and transmits through the R, G, or B color filter 354, and light of a color corresponding to the color filter 354 is incident on the photodiode 352. Accordingly, a color signal (pixel signal) of a light component of a color corresponding to the color filter 354 is output from the photodiode 352.

Figure 16:
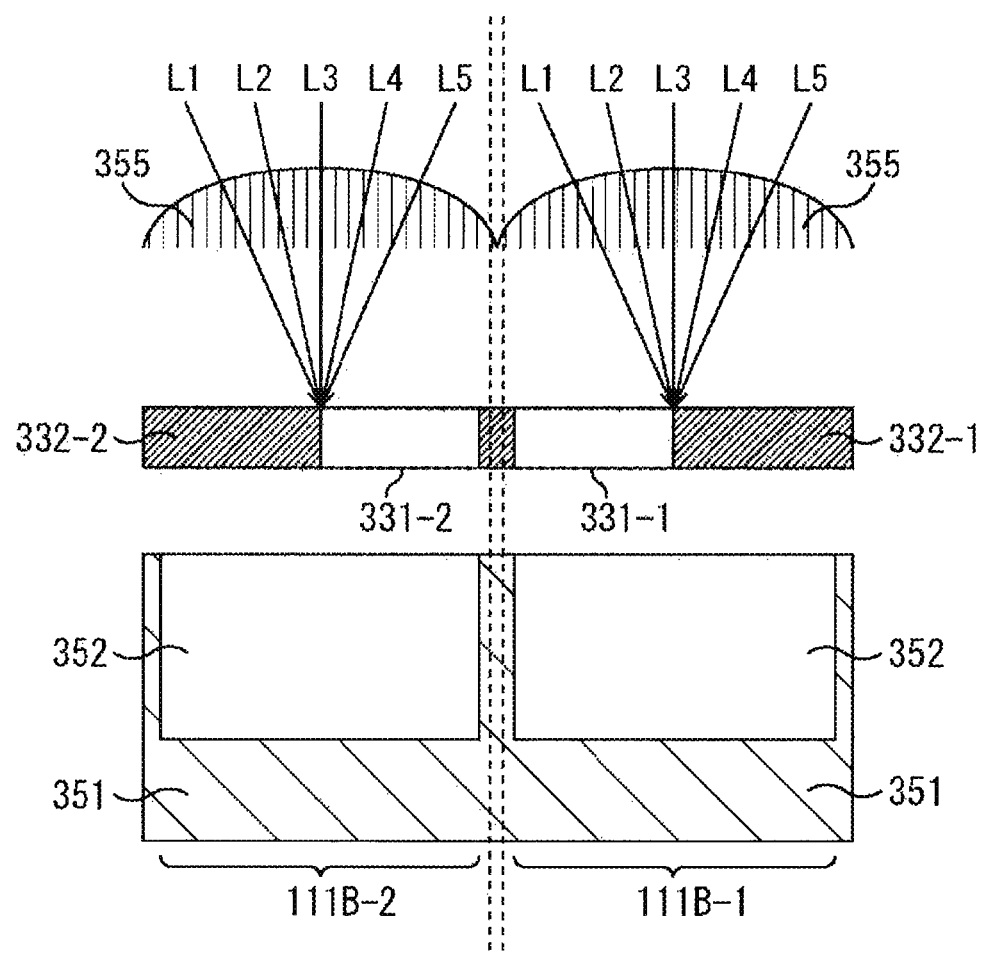
FIG. 16 is a sectional view showing a configuration example of phase difference detection pixels of an embodiment of the image sensor to which the present technology has been applied.

FIG. 16 is a sectional view showing a configuration example of phase difference detection pixels of an embodiment of the image sensor to which the present technology has been applied. FIG. 16 shows a sectional configuration of the two phase difference detection pixels 111B-1 and 111B-2 side by side for the sake of convenience. As shown in FIG. 16, the configuration of the phase difference detection pixels 111B is basically similar to that of the pixels 111 shown in FIG. 15, but the light shielding parts 332-1 and 332-1 and the light transmitting parts 331-1 and 331-2 are arranged instead of the color filter 354 in FIG. 15. The configuration of the light shielding parts 332-1 and 332-2 and the light transmitting parts 331-1 and 331-2 is as described with reference to FIGS. 13 and 14.

Accordingly, in the phase difference detection pixel 111B-2, for example, part of light collected by the on-chip lens 355 transmits through the light transmitting part 331-2, and is incident on the photodiode 352. However, part of the light collected by the on-chip lens 355 is shielded by the light shielding part 332-2 arranged on the right side of the light transmitting part 331-2 in FIG. 16, and is not incident on the photodiode 352.

Further, in the phase difference detection pixel 111B-1, for example, part of light collected by the on-chip lens 355 transmits through the light transmitting part 331-1, and is incident on the photodiode 352. However, part of the light collected by the on-chip lens 355 is shielded by the light shielding part 332-1 arranged on the left side of the light transmitting part 331-1 in FIG. 16, and is not incident on the photodiode 352.

Figure 17:
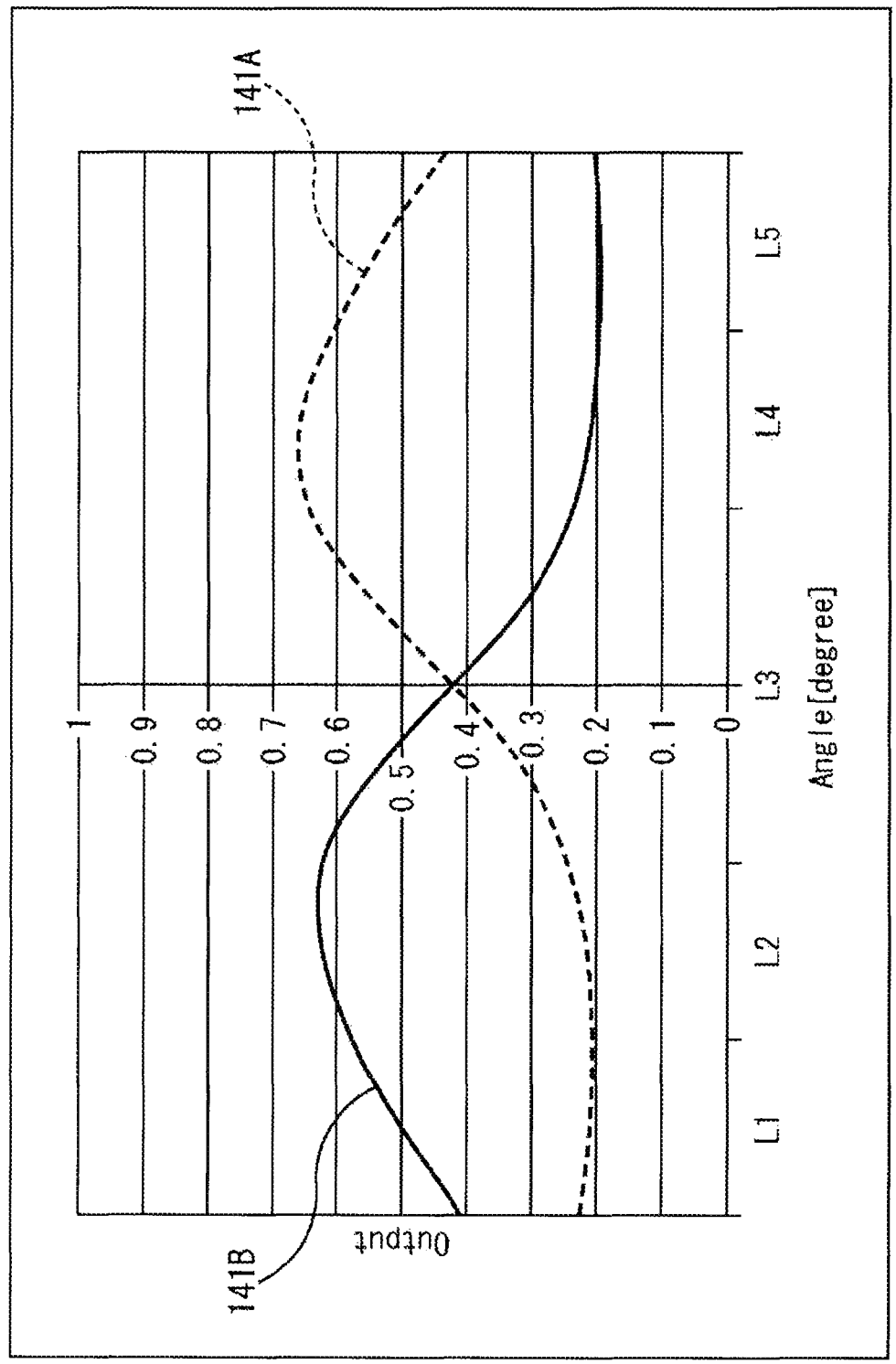
FIG. 17 is a diagram describing phase difference properties of the phase difference detection pixels of an embodiment of the image sensor to which the present technology has been applied.

FIG. 17 is a diagram describing phase difference properties of the phase difference detection pixels of an embodiment of the image sensor to which the present technology has been applied. Hereinafter, the principle of the phase difference detection will be described with reference to FIGS. 16 and 17.

As shown in FIG. 16, incident light rays L1 to L5 from five directions shall be incident on the phase difference detection pixels 111B-1 and 111B-2. Pixel signal outputs of the phase difference detection pixels 111B-1 and 111B-2 at that time are shown in a graph of FIG. 17.

In the graph of FIG. 17, the horizontal axis indicates the incident angles of the incident light rays, and the vertical axis indicates pixel signal outputs of the phase difference detection pixels 111B-1 and 111B-2. Note that a solid line 141B indicates a pixel signal output of the phase difference detection pixel 111B-1, and a broken line 141A indicates a pixel output of the phase difference detection pixel 111B-2.

As shown in this graph, in the phase difference detection pixel 111B-1 in which the left side is shielded, the output becomes larger when incident light is inclined to the left side (negative side), and in the phase difference detection pixel 111B-2 in which the right side is shielded, the output becomes larger when incident light is inclined to the right side (positive side). That is, in a case where an angular component in the negative direction is large in incident light as in the incident light ray L1, the output of the phase difference detection pixel 111B-1 becomes larger than the output of the phase difference detection pixel 111B-2. Then, in a case where an angular component in the positive direction is large in incident light as in the incident light ray L5, the pixel signal output of the phase difference detection pixel 111B-2 becomes larger than the pixel signal output of the phase difference detection pixel 111B-1.

The defocus amount is sensed utilizing phase difference properties of pixel signal outputs of the respective phase difference detection pixels 131 with respect to the incident angle of incident light in such paired phase difference detection pixels 131.

(3-3) Configuration Example of Third Embodiment of Electronic Equipment

Figure 18:
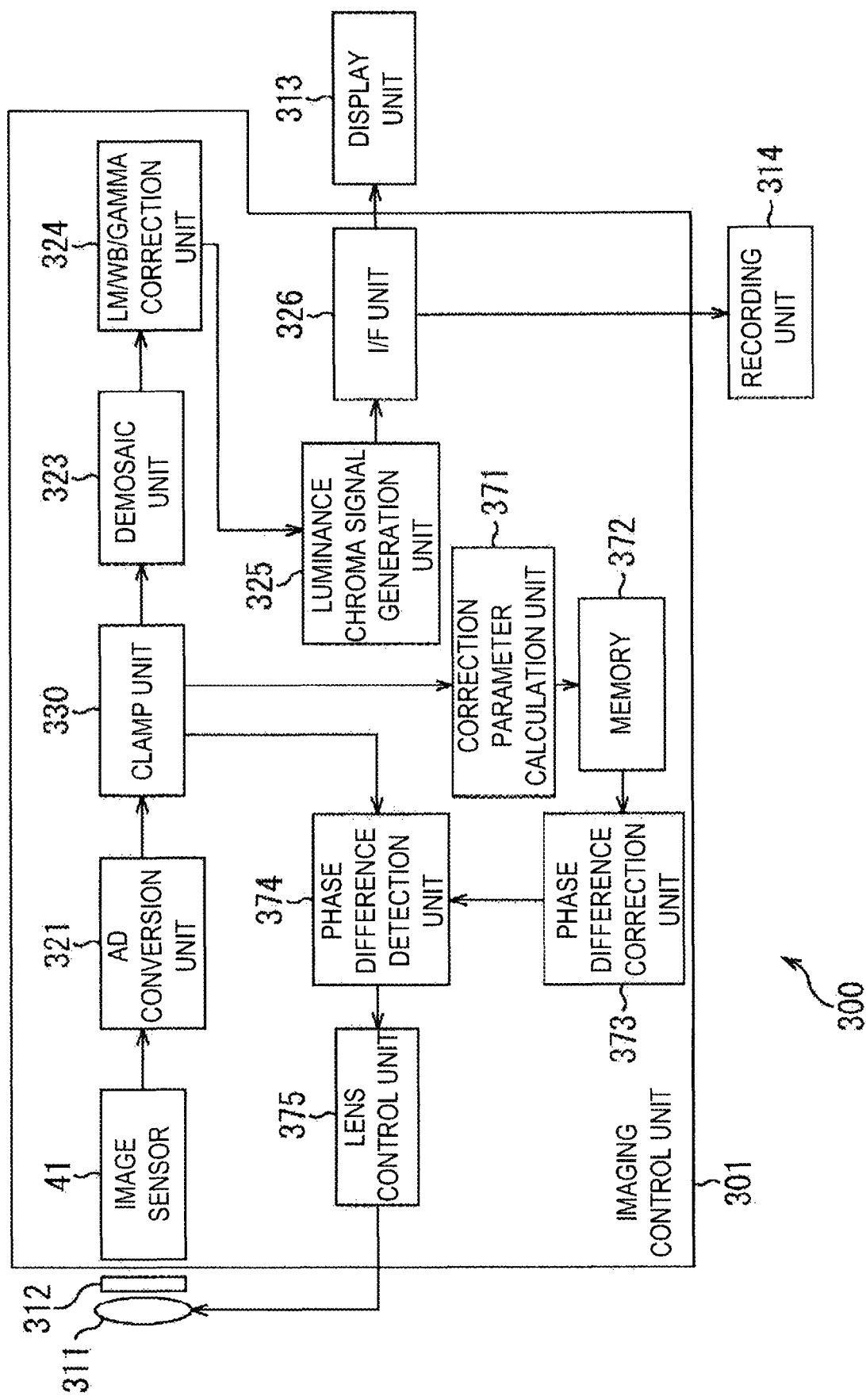
FIG. 18 is a block diagram showing a configuration example of a third embodiment of electronic equipment to which the present technology has been applied.

FIG. 18 is a diagram showing a configuration example of a third embodiment of the electronic equipment to which the present technology has been applied. In the electronic equipment 300 shown in FIG. 18, components having functions identical to those of the electronic equipment 300 in FIG. 10 are denoted by identical names and identical reference characters, and the description will be omitted as appropriate.

That is, the electronic equipment 300 in FIG. 18 is different from the electronic equipment 300 in FIG. 10 in that a correction parameter calculation unit 371, a memory 372, a phase difference correction unit 373, a phase difference detection unit 374, and a lens control unit 375 are further provided.

The correction parameter calculation unit 371 calculates a correction parameter using data about phase difference properties obtained in a test step after manufacturing the image sensor 41, a test step after mounting the lens 311 on the image sensor 41, and the like. This correction parameter is used for correcting a phase difference sensed by the phase difference detection unit 374.

The correction parameter calculated by the correction parameter calculation unit 371 is stored in the memory 372.

The phase difference detection unit 374 performs phase difference detection processing on the basis of image data (pixel value) from the clamp unit 330 to determine whether or not a target object to be focused on (focus target) is in focus. In a case where an object in a focus area is in focus, the phase difference detection unit 374 supplies information indicating that focus has been achieved to the lens control unit 375 as a focus determination result. In addition, in a case where the focus target is out of focus, the phase difference detection unit 373 calculates an out-of-focus amount (defocus amount), and supplies information indicating the calculated defocus amount to the lens control unit 375 as a focus determination result.

The phase difference correction unit 373 corrects a phase difference detected by the phase difference detection unit 374 using the correction parameter stored in the memory 372. The phase difference detection unit 374 supplies a focus determination result corresponding to the corrected phase difference to the lens control unit 375.

The lens control unit 375 controls driving of the lens 311. Specifically, the lens control unit 375 calculates a driven amount of the lens 311 on the basis of the focus determination result supplied from the phase difference detection unit 374, and moves the lens 311 in accordance with the calculated driven amount.

For example, in a case where focus has been achieved, the lens control unit 375 maintains the current position of the lens 311. In addition, in a case where focus has not been achieved, the lens control unit 375 calculates the driven amount on the basis of the focus determination result indicating the defocus amount and the position of the lens 311, and moves the lens 311 in accordance with the driven amount.

(3-4) Phase Difference Auto Focus Processing

Figure 19:
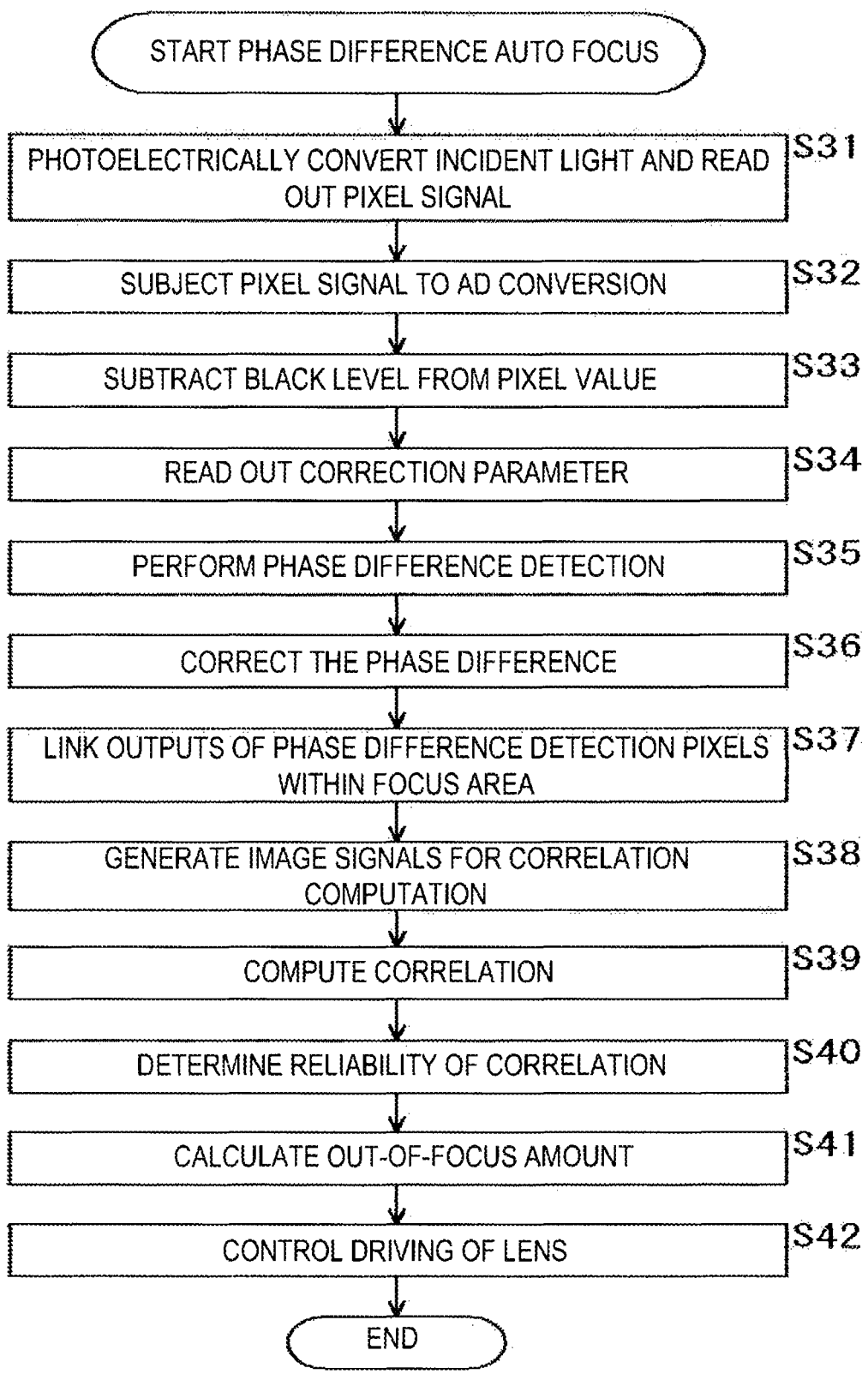
FIG. 19 is a flowchart describing phase difference auto focus processing performed by the electronic equipment of FIG. 18.

Next, phase difference auto focus processing performed by the electronic equipment 300 in FIG. 18 will be described with reference to a flowchart of FIG. 19. When imaging a subject, the phase difference auto focus processing is executed by the electronic equipment 300 before or in parallel with imaging processing.

First, in step S31, the image sensor 41 photoelectrically converts incident light on each of the pixels 111, and reads out each pixel signal for supply to the AD conversion unit 321. Note that the phase difference detection pixel 111B can also be read out at a timing different from the normal pixels 111.

In step S32, the AD conversion unit 321 subjects each pixel signal from the image sensor 41 to AD conversion for supply to the clamp unit 322.

In step S33, the clamp unit 322 subtracts the black level sensed in the optical black (OPB) region provided outside the effective pixel region from each pixel signal (pixel value) from the AD conversion unit 321. The clamp unit 322 supplies image data (pixel value) output from the phase difference detection pixel 111B in image data from which the black level has been subtracted to the phase difference detection unit 374.

In step S34, the phase difference correction unit 373 reads out a correction parameter calculated in advance and stored in the memory 372.

In step S35, the phase difference detection unit 374 performs phase difference detection on the basis of image data (pixel value) from the clamp unit 322. That is, outputs of the phase difference detection pixels 111B that detect phase differences in the longitudinal direction (vertical direction) and in the lateral direction (horizontal direction) are each read out.

In step S36, the phase difference correction unit 373 corrects the phase difference detected by the phase difference detection unit 374 using the correction parameter read out in the processing of step S44. That is, the correction parameter is supplied to the phase difference detection unit 374, and the detected phase difference is corrected.

In step S37, the phase difference detection unit 374 links outputs of the phase difference detection pixels 131 within the focus area. That is, outputs of the phase difference detection pixels 111B within the focus area are linked in accordance with pixel positions, and an AF pixel signal is generated.

In step S38, the phase difference detection unit 374 subjects the AF pixel signal generated in step S37 to shading correction (correction of reduction in the amount of light on a peripheral screen), restoring correction of distortion of two images by vignetting, or the like, and generates a pair of image signals for correlation computation.

Figure 20:
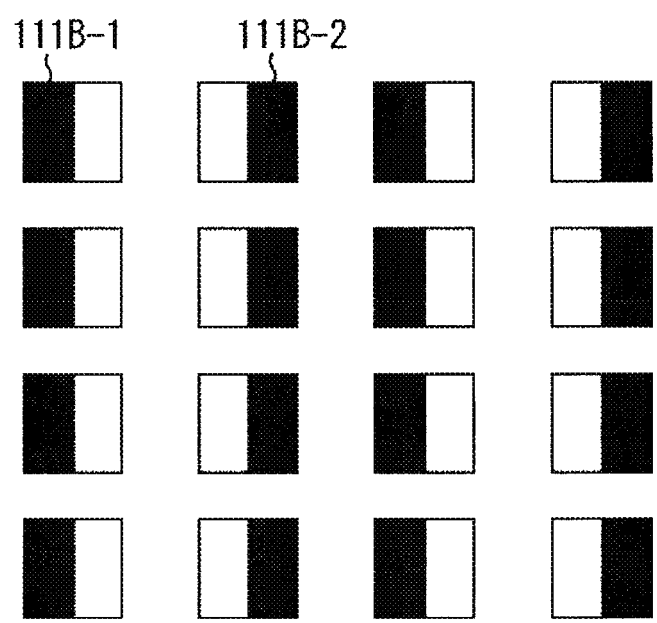
FIG. 20 is a diagram showing a configuration of phase difference detection pixels of an embodiment of the image sensor to which the present technology has been applied.

FIG. 20 is a diagram showing a configuration of the phase difference detection pixels 111B-1 and 111B-2 of an embodiment of the image sensor to which the present technology has been applied. As shown in FIG. 20, the image sensor 41 of the present embodiment has the phase difference detection pixel 111B-2 for detecting a phase difference in the lateral direction and the phase difference detection pixel 111B-1 for detecting a phase difference in the lateral direction to be paired with the phase difference detection pixel 111B-2.

Signals of the phase difference detection pixels 111B are subjected to grouping processing. As shown in FIG. 20, the phase difference detection pixels 111B-1 and 111B-2 for detecting a phase difference in the lateral direction are grouped, that is, in the lateral direction, into the second row, the eighth row, . . . , for example.

Specifically, an image signal SIGh(A) for phase difference detection obtained by linking, in the lateral direction, pixel signals obtained in the phase difference detection pixels 111B-2 included in a focus area Rh for phase difference detection in the lateral direction is generated. In addition, similarly, an image signal SIGh(B) for phase difference detection obtained by linking, in the lateral direction, pixel signals obtained in the phase difference detection pixels 111B-1 included in the focus area Rh is generated.

In step S39, the phase difference detection unit 374 computes a correlation between the paired image signals for phase difference detection. That is, a correlation in phase difference between the image signal SIGh(A) and the image signal SIGh(B) is computed.

In step S40, the phase difference detection unit 374 determines the reliability of the correlation. That is, the reliability of the correlation computation result computed in step S39 is determined. Here, the reliability refers to the degree of agreement (similarity in waveform) between the paired image signals, and in a case where the degree of agreement is favorable, the reliability of a focus sensing result is generally high.

For example, by calculating the phase difference between the image signal SIGh(A) and the image signal SIGh(B) in the focus area Rh by publicly-known correlation computation, an out-of-focus amount (defocus amount) in the lateral direction can be obtained.

In step S41, the phase difference detection unit 374 calculates the out-of-focus amount. That is, a final out-of-focus amount is calculated on the basis of the phase difference obtained in step S40 from the paired image signals determined that the reliability is high.

In step S42, the lens control unit 375 controls driving of the lens 311 on the basis of the focus determination result from the phase difference detection unit 374. Focus control is performed in the above manner. This processing is executed repeatedly according to necessity.

Note that the lens control unit 375 may control driving of the lens 311 by performing contrast auto focus in addition to phase difference auto focus as described above. For example, in a case where information indicating the out-of-focus amount (defocus amount) is supplied from the phase difference detection unit 374 as a focus determination result, the lens control unit 375 may determine an out-of-focus direction (front focus or rear focus) to perform contrast auto focus in that direction.

Note that, since imaging processing performed by the electronic equipment 300 in FIG. 18 is similar to the processing described with reference to the flowchart of FIG. 11, the description is omitted.

According to the above processing, AF accuracy can be improved, and degradation in image quality can be suppressed.

In addition, as shown in the lower stage of FIG. 12, by reading out the phase difference detection pixel 111B at time t20 to t21, and then executing phase difference auto focus processing while reading out normal addition pixels at time t21 to t22 to perform focus adjustment by means of the lens 311, continuous imaging can be performed while causing focus to follow the motion of a subject, and degradation in image quality can be suppressed.

(3-5) Modification Example of Third Embodiment (Pixel Arrangement Example of Providing Phase Difference Detection Pixel or Black Pixel Within Subblock)

The example in which the central pixel among 3×3 pixels constituting the subblock 103 is configured as a phase difference detection pixel has been described above, but part of the phase difference detection pixel may be used as a black pixel.

Figure 21:
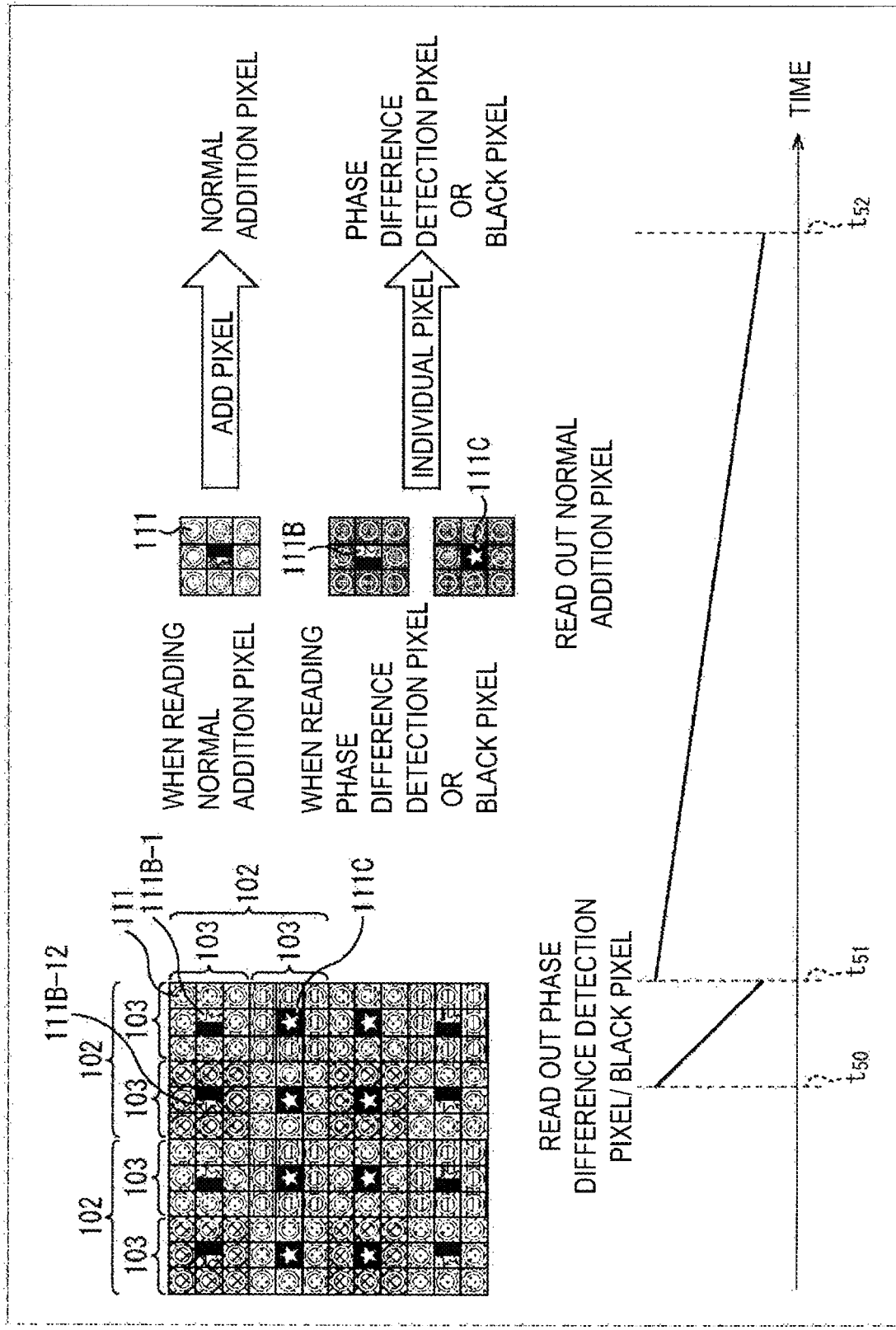
FIG. 21 is a diagram describing a pixel arrangement example in which phase difference detection pixels and black pixels are provided for normal pixels.

More specifically, as shown at the upper left part of FIG. 21, in the upper-stage blocks 102, the central pixels among 3×3 pixels constituting the upper-stage subblocks 103 are configured as the phase difference detection pixels 111B-1 and 111B-2, and the central pixels among 3×3 pixels constituting the lower-stage subblocks 103 are configured as black pixels 111C.

Further, in the lower-stage blocks 102, the central pixels among 3×3 pixels constituting the upper-stage subblocks 103 are configured as black pixels 111C, and the central pixels among 3×3 pixels constituting the lower-stage subblocks 103 are configured as the phase difference detection pixels 111B-1 and 111B-2.

Here, the black pixel 111C is a pixel corresponding to a pixel configured for obtaining the black level provided in the OPB region provided for the image non-output region 44B in FIG. 6. In more detail, the black pixel 111C is a pixel fully covered by the light shielding part 332 including a film of metal such as copper as described with reference to FIG. 13.

With such a configuration, as shown at the upper right part of FIG. 21, eight normal pixels 111 are added and output as normal addition pixels, and the phase difference detection pixels 111B-1 and 111B-2, and the black pixel 111C are each output.

For a pixel signal of each of the pixels 111 on the subblock 103 basis, the black level of the black pixel 111C in the neighborhood is read out and used for subtraction of the black level in the processing in steps S13 (FIG. 7), S23 (FIG. 11), and S33 (FIG. 19) described above.

With such a configuration, as shown in the lower stage of FIG. 21, pixel signals of the phase difference detection pixels 111B-1 and 111B-2, and the black pixel 111C are read out at time t50 to t51, and thereafter, the normal addition pixels are read out at time t51 to t52.

In such an order of reading out, by reading out the phase difference detection pixels 111B-1 and 111B-2 first, and then executing phase difference auto focus processing while reading out normal addition pixels at a later timing to perform focus adjustment by means of the lens 311, continuous imaging can be performed while causing focus to follow the motion of a subject, and degradation in image quality can be suppressed.

Further, by subtracting the black level of the black pixel 111C in the neighborhood for each of the subblocks 103 by subtraction of the black level through use of a black pixel read out earlier after the normal addition pixels are read, the image quality can be increased.

Since the pixels 111 in the OPB region set within the image non-output region 44B provided around the image output region 44A in FIG. 6 has been assumed as a black level so far, correction through use of variations in black level produced two-dimensionally in the image output region 44A could not have been performed. However, pixel signal correction through use of a detection result of a two-dimensional black level through use of the black pixel 111C of the present disclosure allows variations in black level produced two-dimensionally to be suppressed, and clamp processing with higher accuracy can be achieved.

Further, since the need for providing the image non-output region 44B as shown in FIG. 6 and setting the OPB region is eliminated, the image sensor 41 can be reduced in size, and cost reduction resulting from the size reduction can be achieved.

4. Fourth Embodiment

(4-1) Pixel Arrangement Example Through Use of White Pixel

The example in which the central pixel among 3×3 pixels constituting the subblock 103 is configured as a phase difference detection pixel or a black pixel has been described above, but a white pixel can be used instead of the phase difference detection pixel or the black pixel.

Figure 22:
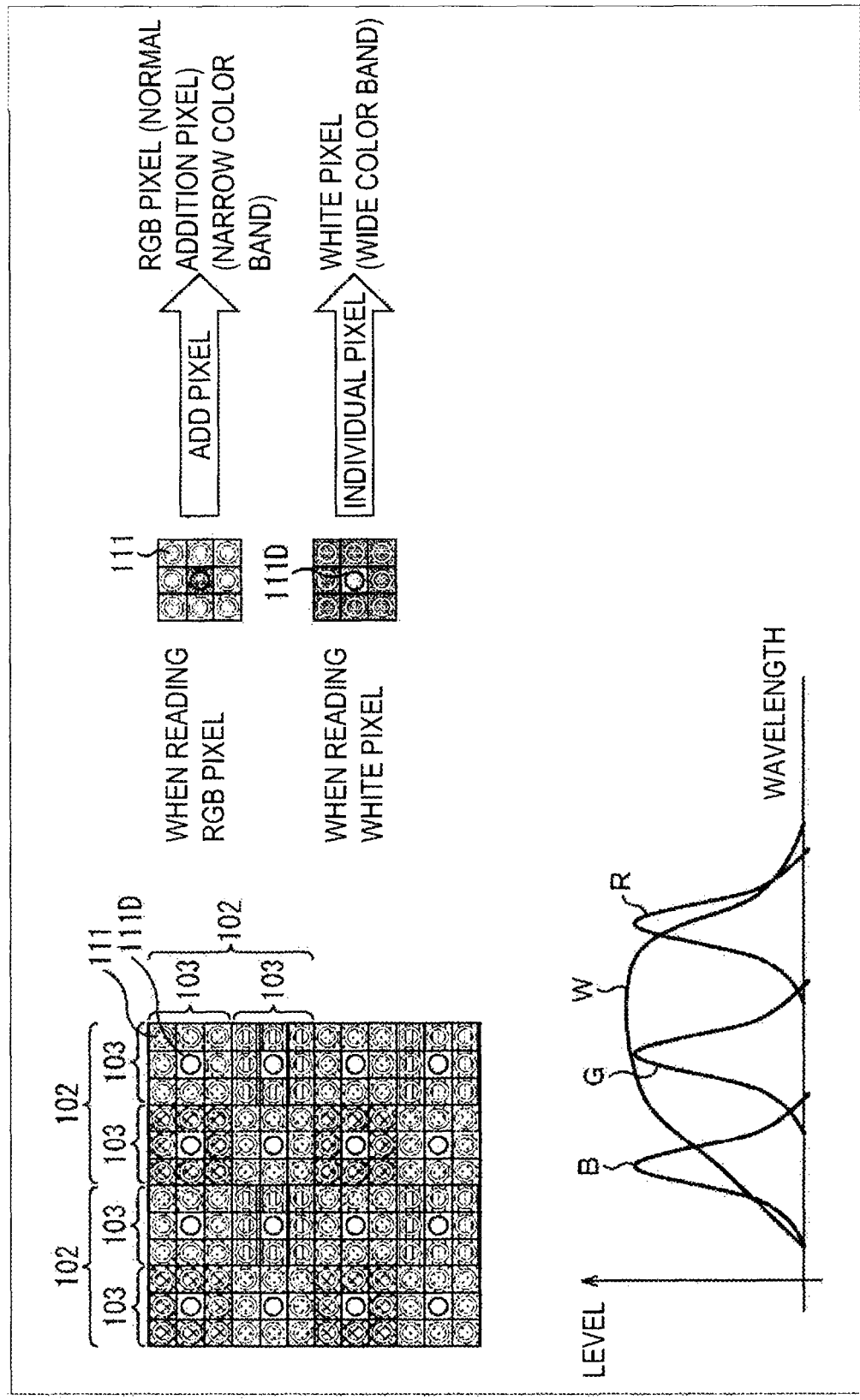
FIG. 22 is a diagram describing a pixel arrangement example in which white pixels are provided for normal pixels.

More specifically, as shown at the upper left part of FIG. 22, in each of the blocks 102, the central pixel among 3×3 pixels constituting the subblock 103 is configured as a white pixel 111D. The white pixel 111D is not provided with a transparent color filter 354 or the color filter 354, and white light is incident on the photodiode 352.

With such a configuration, as shown at the upper right part of FIG. 22, pixel signals of the normal eight pixels 111 on the subblock 103 basis are added, so that pixel signals of the normal addition pixels of a narrow color band of the Bayer array are read out.

On the other hand, the white pixel 111D outputs a luminance signal itself since white light is incident.

Thus, signals respectively indicated by waveforms R, G, B, and W are output from the normal addition pixels and the white pixel 111D in each of the RGB subblocks 103, for example, as shown at the lower left part of FIG. 22. In the lower left part of FIG. 22, the horizontal axis indicates the wavelength, and the vertical axis indicates the pixel signal level.

In this manner, the pixel signals of the normal addition pixels output from each of the RGB subblocks 103 in the Bayer array become signals of a narrow color band, whilst the luminance signal output from the white pixel 111D becomes a signal of a wide color band.

Therefore, spurious resolution and high frequency false color are reduced using signals of a narrow color band which are pixel signals of normal addition pixels output from each of the RGB subblocks 103 and a signal of a wide color band.

More specifically, first, signals of a narrow color band which are pixel signals of normal addition pixels output from each of the RGB subblocks 103 are subjected to a low pass filter (LPF) to extract color DC components. Next, a signal of a wide color band output from the white pixel 111D is subjected to a high pass filter (HPF) to extract a luminance AC component.

Then, the DC components of respective pixel signals of RGB normal addition pixels having been subjected to LPF and the AC component of the luminance signal having been subjected to HPF are added.

That is, since a high frequency component degrades in response when the pixel signals of the RGB normal addition pixels are subjected to LPF, correction is made such that the degradation in response is compensated for by the AC component of the luminance component having been subjected to HPF.

With such processing, spurious resolution and high frequency false color can be reduced.

(4-2) Configuration Example of Fourth Embodiment of Electronic Equipment

Figure 23:
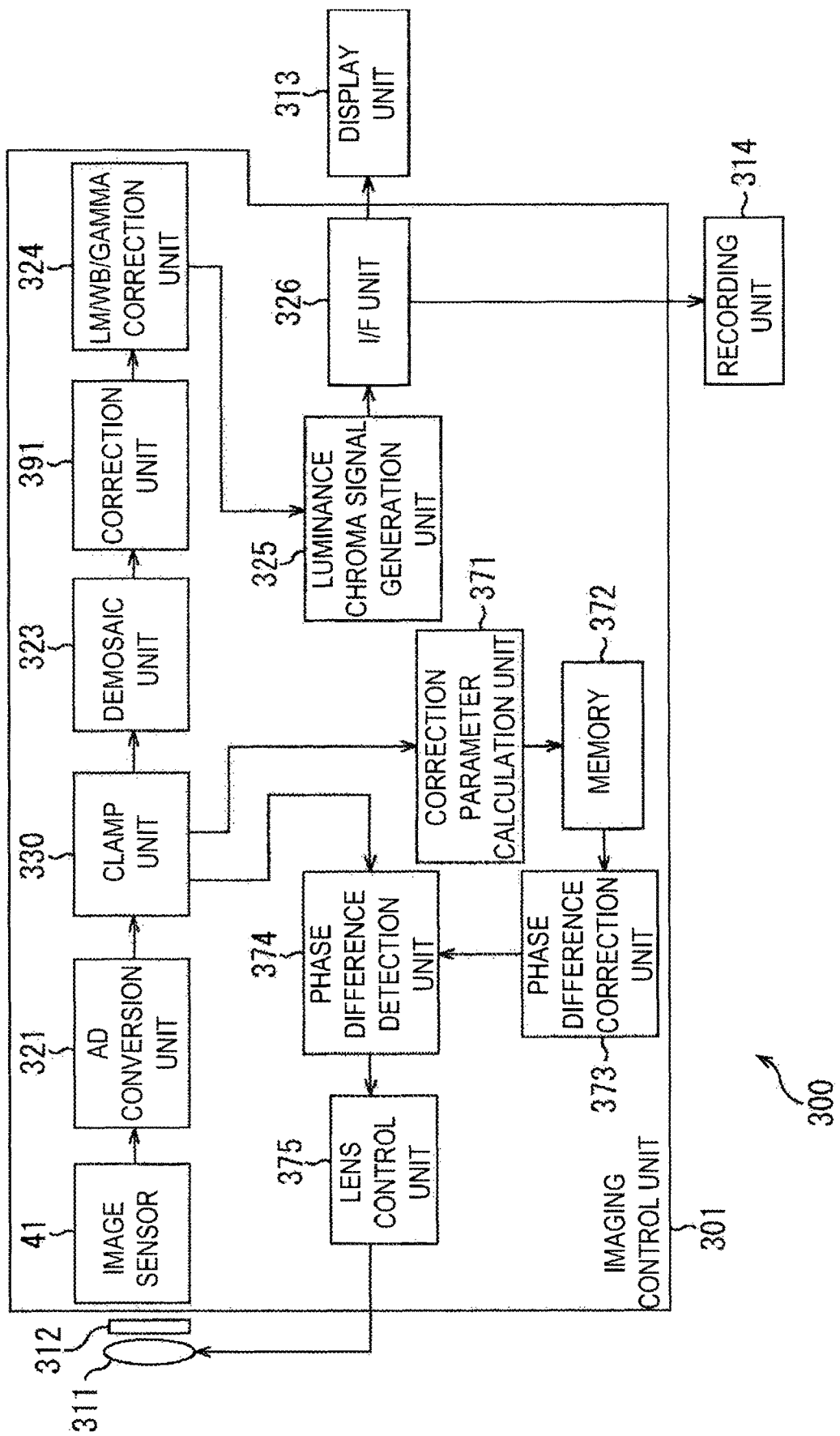
FIG. 23 is a block diagram showing a configuration example of a fourth embodiment of electronic equipment to which the present technology has been applied.

FIG. 23 is a diagram showing a configuration example of a fourth embodiment of the electronic equipment to which the present technology has been applied. In the electronic equipment 300 shown in FIG. 23, components having functions identical to those of the electronic equipment 300 in FIG. 18 are denoted by identical names and identical reference characters, and the description will be omitted as appropriate.

That is, the electronic equipment 300 in FIG. 23 is different from the electronic equipment 300 in FIG. 18 in that a correction unit 391 is provided between the demosaic unit 323 and the LM/MB/gamma correction unit 324.

The correction unit 391 subjects the signals of a narrow color band which are the pixel signals of the normal addition pixels output from each of the RGB subblocks 103 to a low pass filter (LPF) to extract color DC components, and subjects a signal of a wide color band output from the white pixel 111D to a high pass filter (HPF) to extract a luminance AC component, and adds them.

With this processing, when subjected to LPF, correction is made such that a high frequency component of color DC components being reduced is compensated for by the AC component of the luminance component having been subjected to HPF to reduce spurious resolution and high frequency false color.

Note that a detailed configuration of the correction unit 391 will be described later with reference to FIG. 24.

(4-3) Configuration Example of Correction Unit

Figure 24:
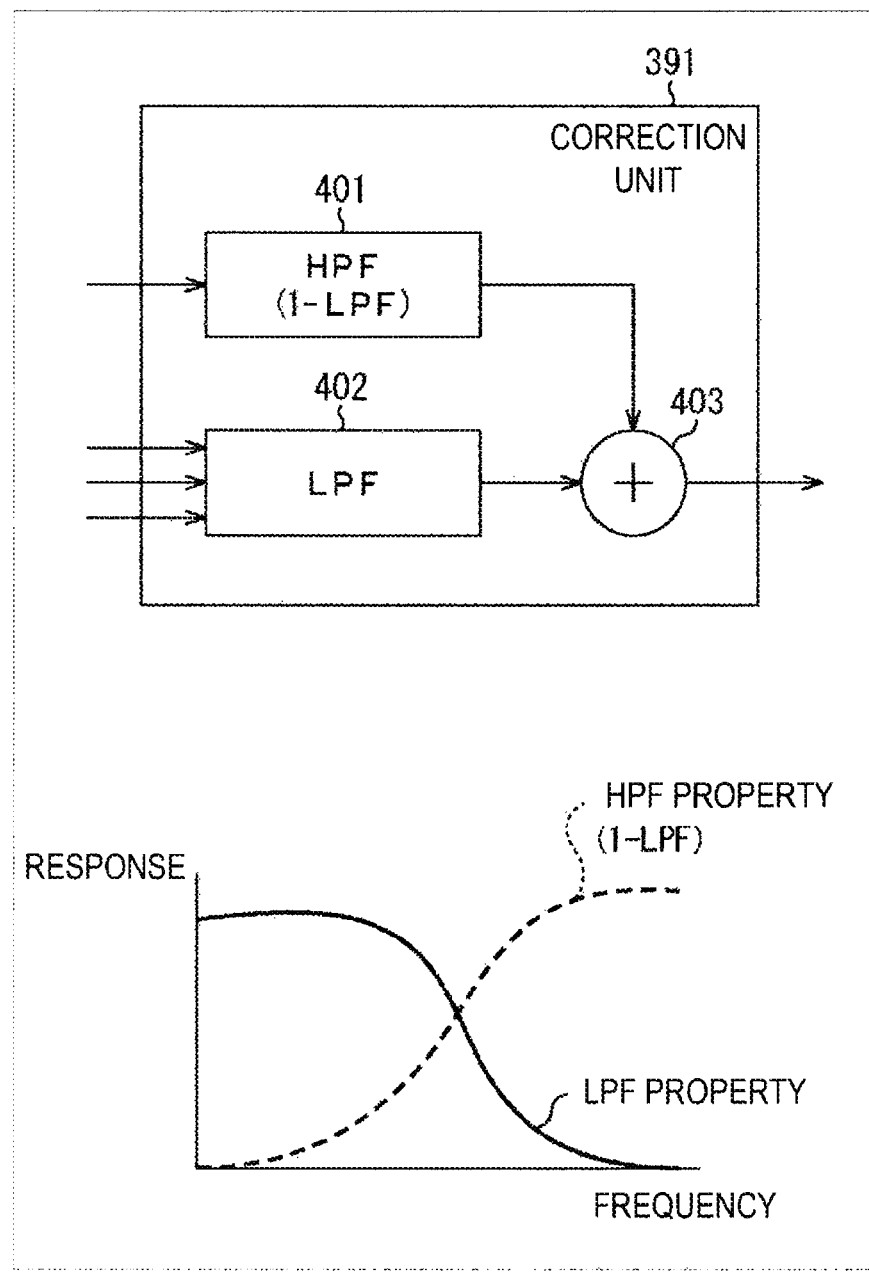
FIG. 24 is a block diagram showing a configuration example of a correction unit of FIG. 23.

The upper part of FIG. 24 is a diagram showing a configuration example of the correction unit 391 in FIG. 23, and the lower part of FIG. 24 is a waveform diagram showing a relation between input signal frequency and response output of an HPF 401 and an LPF 402.

The correction unit 391 includes the high pass filter (HPF) 401, the low pass filter (LPF) 402, and an addition unit 403.

The HPF 401 extracts an AC component from a luminance signal supplied from the white pixel 111D of each of the RGB subblocks 103 for output to the addition unit 403.

The LPF 402 extracts DC components from pixel signals from normal addition pixels of each of the RGB subblocks 103 for output to the addition unit 403.

The addition unit 403 adds the DC components of the pixel signals from the normal addition pixels of each of the RGB subblocks 103 from the LPF 402 and the AC component of the luminance signal from the HPF 401 for output as a color signal of the RGB subblocks 103.

That is, as shown by the waveform showing properties of the LPF 402 with a solid line at the lower part of FIG. 24, the LPF 402 has a high response output when the input signal frequency is low, and has a low response output when the frequency becomes high. In contrast, as shown by the waveform showing properties of the HPF 401 with a dotted line at the lower part of FIG. 24, the HPF 401 has a low response output when the input signal frequency is low, and has a high response output when the frequency becomes high. That is, when assuming that the maximum value of response output is 1, the response output of the HPF 401 is a value obtained by subtracting the response output of the LPF 402 from 1.

Therefore, for pixel signals of normal addition pixels of the RGB subblocks 103, the response output increases/decreases in accordance with RGB frequencies when subject to the LPF 402, occurrence of spurious resolution and false color can be suppressed by compensating for the AC component extracted from the luminance signal by the HPF 401 for a color of a high frequency wavelength.

(4-4) Imaging Processing Performed by Electronic Equipment in FIG. 23

Figure 25:
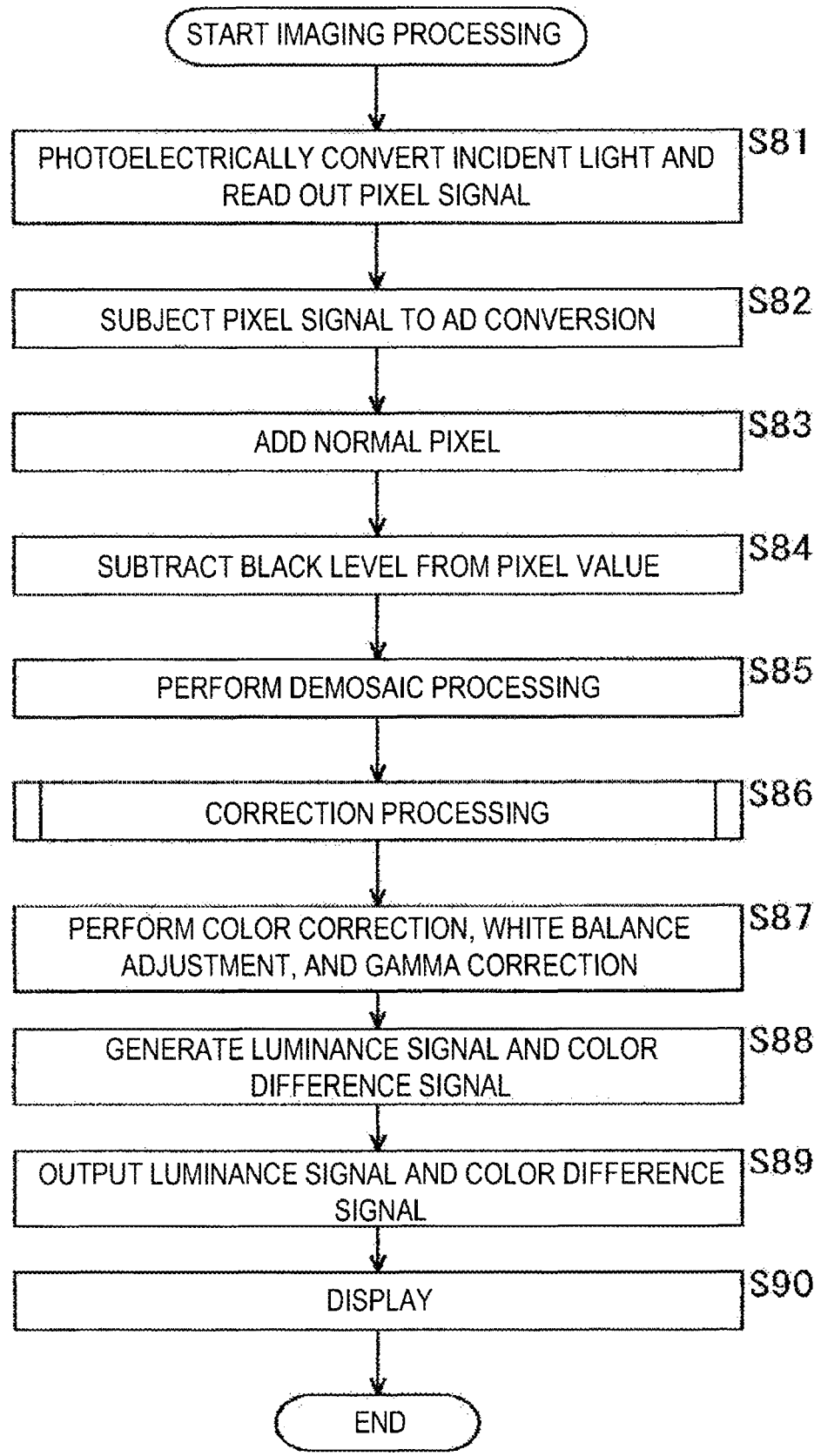
FIG. 25 is a flowchart describing imaging processing performed by the electronic equipment of FIG. 23.

Next, imaging processing performed by the electronic equipment 300 in FIG. 23 will be described with reference to a flowchart of FIG. 25. Note that, since the processing in steps S81 to S83, S85S, 87 to S90 in the flowchart of FIG. 25 is similar to that of steps S21 to S23 and S25 to S29 described with reference to the flowchart of FIG. 11, the description will be omitted. That is, in the flowchart of FIG. 25, processing different from the flowchart of FIG. 11 is processing in steps S84 and S86.

In step S84, for each of the subblocks 103, the clamp unit 330 subtracts, from pixel signals (pixel values) of normal addition pixels from the AD conversion unit 321, a black level sensed as a pixel signal of a corresponding black pixel 111C. The clamp unit 330 supplies image data (pixel values) of all the pixels from which the black levels have been subtracted to the demosaic unit 323. That is, here, the black level which is the pixel signal of the black pixel 111C is subtracted from pixel signals of normal addition pixels on the subblock 103 basis. As a result, two-dimensional variations in black level that may occur on the pixel 111 basis on the pixel array 44 can be corrected with high accuracy.

In addition, in step S86, the correction unit 391 executes correction processing to extract the DC components of pixel signals of normal addition pixels of the RGB subblocks 103, and extracts the AC component of the luminance signal of the corresponding white pixel 111D for addition, so that occurrence of spurious resolution and false color is suppressed.

(4-5) Correction Processing

Figure 26:
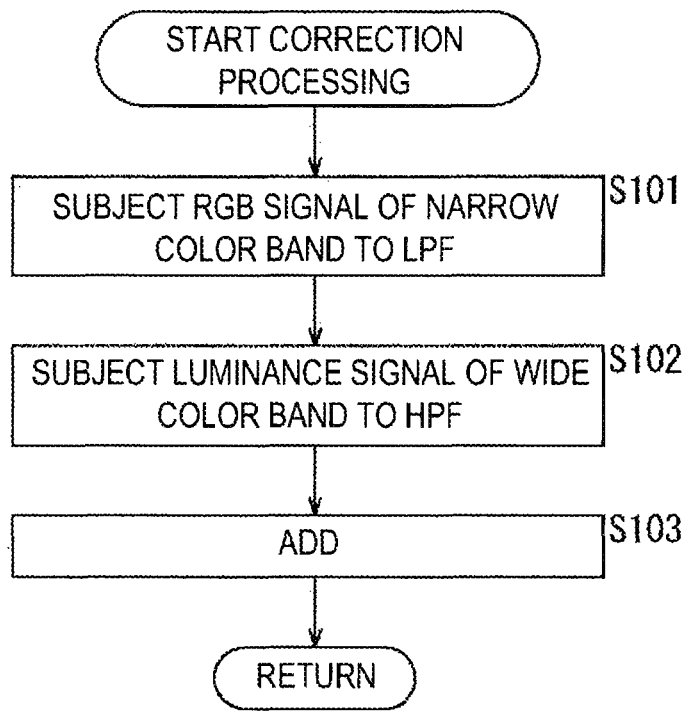
FIG. 26 is a flowchart describing correction processing performed by the correction unit of FIG. 23.

Here, correction processing performed by the correction unit 391 will be described with reference to a flowchart of FIG. 26.

In step S101, the LPF 402 subjects a pixel signal of a narrow color band corresponding to each of the RGB subblocks 103 in the Bayer array to LPF to extract a color DC component for output to the addition unit 403.

In step S102, the HPF 401 subjects a luminance signal of a wide color band corresponding to each of the RGB subblocks 103 in the Bayer array to HPF to extract a luminance AC component for output to the addition unit 403.

In step S103, for each of the RGB subblocks 103 in the Bayer array, the addition unit 403 adds the luminance AC component supplied from the HPF 401 and the color DC components supplied from the LPF 402 for output to the clamp unit 322.

With the above processing, in a case where the LPF 402 subjects pixel signals of normal addition pixels of the RGB subblocks 103 according to the RGB frequencies, the response output increases/decreases in accordance with the frequencies, therefore occurrence of spurious resolution and false color can be suppressed by compensating for the AC component extracted from the luminance signal by the HPF 401 for a color of a high frequency wavelength. Note that the order of processing in steps S101 and S102 may be exchanged, but processing is performed substantially in parallel.

(4-6) Modification Example of Fourth Embodiment (Pixel Arrangement Example of Providing White Pixel or Phase Difference Detection Pixel Within Subblock)

The example in which the central pixel among 3×3 pixels constituting the subblock 103 is the white pixel 111D has been described above, but part of the white pixel 111D may be used as a phase difference detection pixel.

Figure 27:
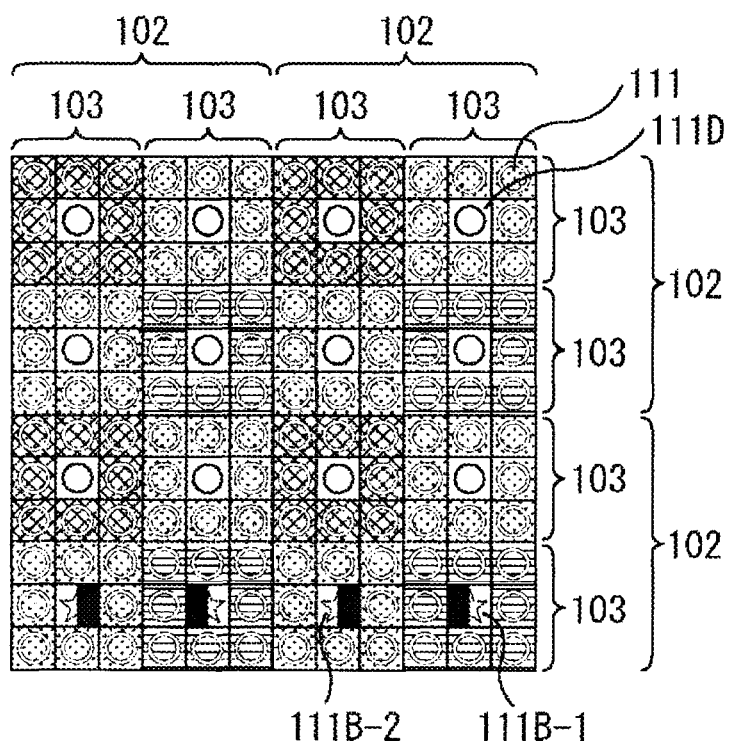
FIG. 27 is a diagram describing a configuration example in which a white pixel or a phase difference detection pixel is provided within a subblock.

More specifically, as shown in FIG. 27, in the upper-stage blocks 102, the central pixel among 3×3 pixels constituting the subblock 103 is configured as the white pixel 111D.

On the contrary, in the lower-stage blocks 102, the central pixels among 3×3 pixels constituting the upper-stage subblocks 103 are configured as white pixels 111D, and the central pixels among 3×3 pixels constituting the lower-stage subblocks 103 are configured as the phase difference detection pixels 111B-1 and 111B-2.

That is, in the upper-stage blocks 102, eight normal pixels 111 are added and output as normal addition pixels. On the other hand, in the upper-stage subblocks 103 in the lower-stage blocks 102, pixel signals of eight normal pixels 111 are added and output as normal addition pixels, and in the lower-stage subblocks 103, the phase difference detection pixels 111B-1 and 111B-2 are each output. That is, two pairs of the phase difference detection pixels 111B-1 and 111B-2 are arranged on the 2×2 blocks 102 basis.

With pixel signals being read out from these two pairs of the phase difference detection pixels 111B-1 and 111B-2, phase difference auto focus processing is executed, and after focus by means of the lens 311 is adjusted, an image in a state where focus has been adjusted is read out by means of normal addition pixels, and correction processing through use of the white pixel 111D can be achieved, so that degradation in image quality can be suppressed.

5. Timing of Outputting Pixel Signal From Image Sensor

The example in which, for output of pixel signals from the image sensor 41, pixel signals of normal eight pixels 111 constituting the subblock 103 and a pixel signal of another pixel (hereinafter also referred to as a functional pixel 111X) having some function are output to the clamp unit 330 at different timings has been described above.

Figure 28:
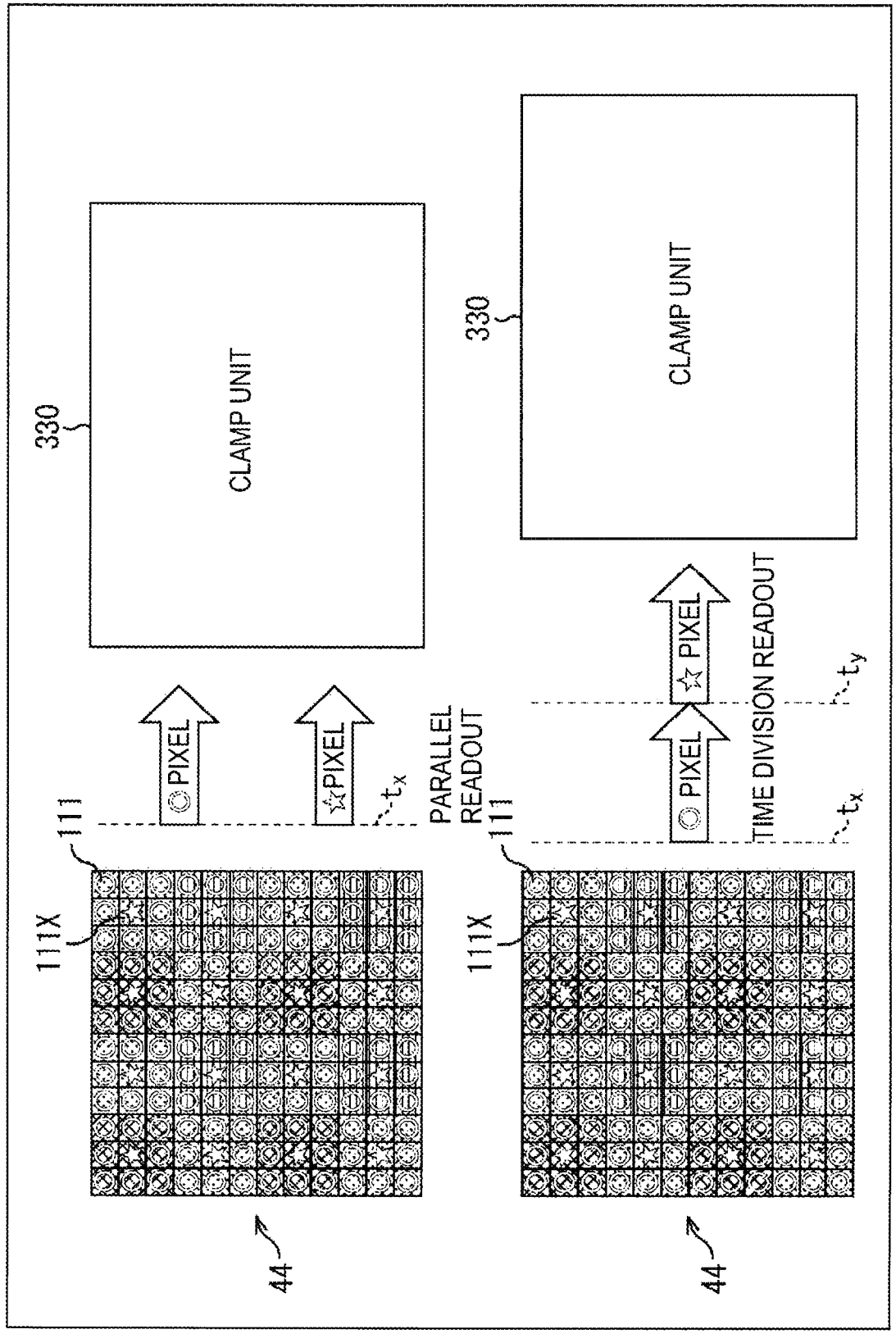
FIG. 28 is a diagram describing a timing example of outputting a pixel signal from an image sensor.

However, as shown in the upper stage of FIG. 28, parallel readout may be performed such that the pixel signals of the normal eight pixels 111 and a pixel signal of the remaining functional pixel 111X are output to the clamp unit 330 at an identical timing.

In this case, in a case where the processing timing is actually different between the pixel signal of the functional pixel 111X and the pixel signals of the normal pixels 111, the clamp unit 322 needs to adjust the timing by buffering the pixel signals different in processing timing, or the like.

Note that the functional pixel 111X is a generic term for the individual pixel 111A, the phase difference detection pixels 111B-1 and 111B-2, the black pixel 111C, and the white pixel 111D described above.

In addition, in such a case where the processing order and timings of the normal pixels 111 and the functional pixel 111X have been determined in a later stage of the image sensor 41, output may be performed in conformity with the processing order and timings.

For example, as shown in the lower stage of FIG. 28, time division readout may be performed such that the pixel signals of the normal pixels 111 are output at time tx, and then, the pixel signal of the functional pixel 111X is output at time ty. In addition, the order may be exchanged to perform time division readout such that the pixel signal of the functional pixel 111X is output, and then, the pixel signals of the normal pixels 111 are output.

6. Arrangement Example of Column AD Conversion Units

Figure 29:
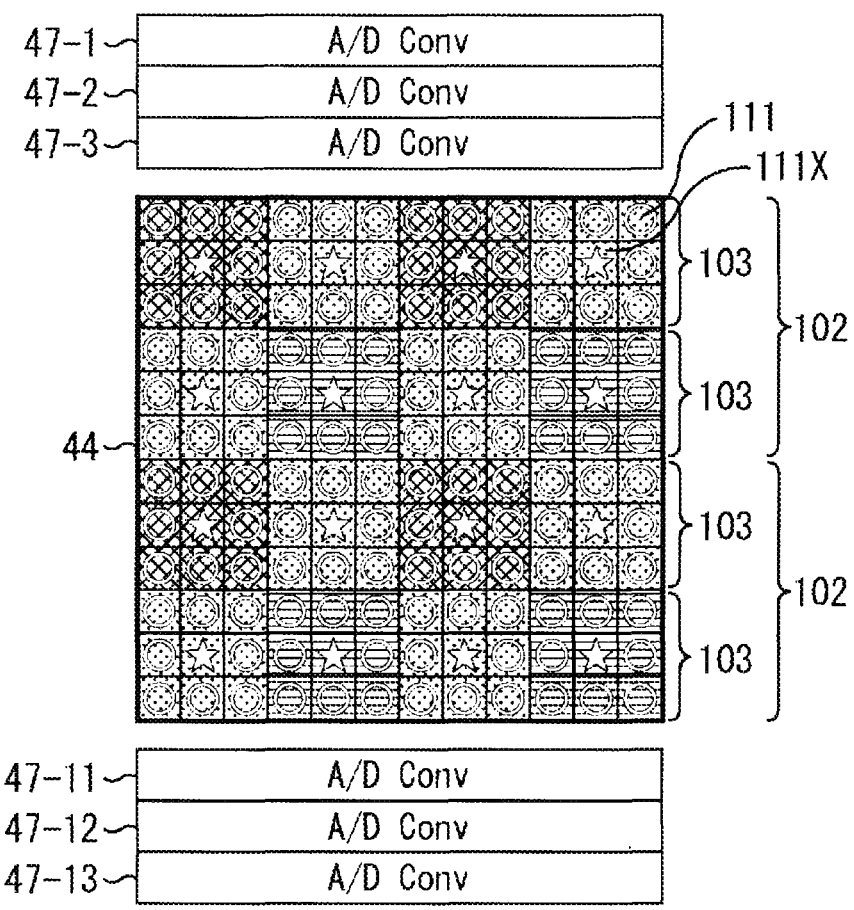
FIG. 29 is a diagram describing an example of providing column AD conversion units in multiple stages.

The configuration example in which the column AD conversion unit 47 is provided with one ADC 55 for one of the vertical signal lines 53, and performs AD conversion for each row has been described above, but column AD conversion units 47-1 to 47-3 and 47-11 to 47-13 may be each provided in three rows each at the top and bottom, so that, for the upper-half blocks 102 in the pixel array 44, every three columns of the pixels 111 on the subblock 103 basis are subjected to AD conversion by the column AD conversion units 47-1 to 47-3 provided at the upper part, and for the lower-half blocks 102 in the pixel array 44, every three columns of the pixels 111 on the subblock 103 basis are subjected to AD conversion by the column AD conversion units 47-1 to 47-3 provided at the lower part, as shown in FIG. 29, for example.

With such a configuration, since pixel signals of the pixels 111 necessary for addition can be prepared at the same time when adding the eight normal pixels 111, the pixel signals of the normal addition pixels can be obtained without requiring a memory or the like.

In addition, since pixel signals can be subjected to AD conversion for every three rows, the processing speed concerning AD conversion can be improved. Note that, not only providing in three rows each at the top and bottom, the column AD conversion units 47 may further be provided in another number of rows that are rows of a multiple of 3. Note that the column AD conversion units 47 amount to the number that conforms to the number of pixels constituting the subblock 103. Thus, in a case where the subblock 103 includes Q×Q pixels, for example, it is desirable that the column AD conversion units 47 are provided in rows of a multiple of Q each.

7. Variations of Pixel Arrangement

Various variations can be considered for the pixel arrangement of the normal pixels 111 and the functional pixel 111X including the individual pixel 111A, the phase difference detection pixels 111B-1 and 111B-2, the black pixel 111C, and the white pixel 111D in the pixel array 44.

For example, as shown at the upper left part of FIG. 30, the normal pixels 111 may be arranged at five positions, as the central pixel, above, below, on the left, and on the right of the central pixel on the subblock 103 basis, and the functional pixels 111X may be arranged at the remaining four corners.

Figure 30:
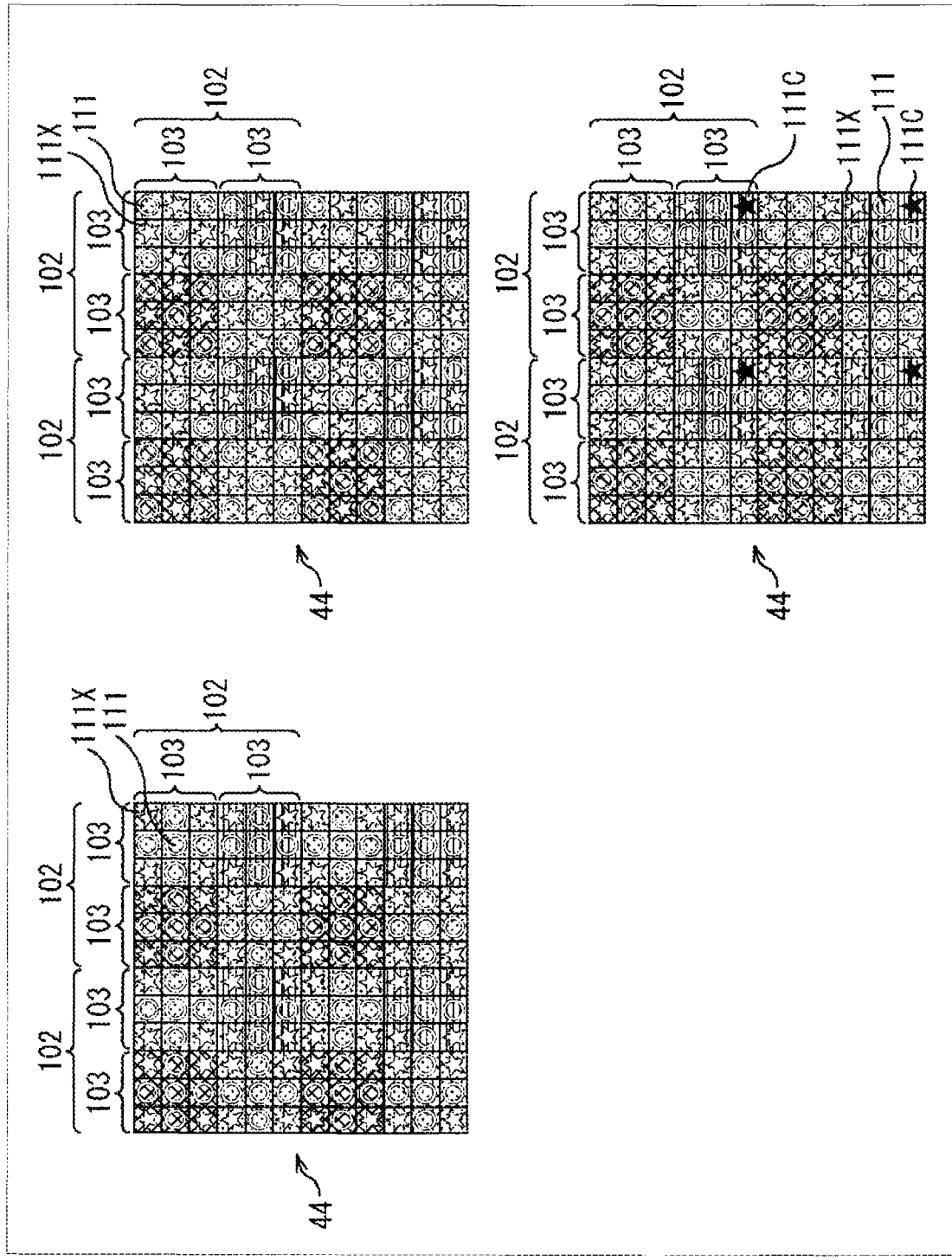
FIG. 30 is a diagram describing variations of pixel arrangement example.

In addition, as shown at the upper right part of FIG. 30, for example, the pixels 111 may be arranged at five positions, as the central pixel and on the upper left and right and on the lower left and right of the central pixel on the subblock 103 basis, and the functional pixels 111X may be arranged at the remaining four positions.

By arranging the normal pixels 111 longitudinally and laterally symmetrically within the subblock 103 as shown at the upper left part and the upper right part of FIG. 30, occurrence of a phase shift between color pixels within the subblock 103 can be suppressed.

That is, in a case where normal pixels are not arranged symmetrically within the subblock 103, pixels may be chipped at a certain angle when displaying a thin slanting line or the like, resulting in occurrence of false color. Thus, when the normal pixels 111 are arranged longitudinally and laterally symmetrically within the subblock 103, occurrence of false color can be suppressed.

In addition, by matching the number of the normal pixels 111 and the number of the functional pixels 111X, the ratio between output levels of the pixels 111 and the functional pixels 111X can be matched.

Further, as shown at the lower right part of FIG. 30, the pixel at the lower right part, that is, only the pixel at the lower right in the B subblock 103 may be the black pixel 111C on the block 102 basis.

In this case, the functional pixels 111X excluding the black pixel 111C within the subblock 103 are arranged asymmetrically, but the normal pixels 111 are arranged longitudinally and laterally symmetrically within the subblock 103, so that occurrence of a phase shift between color pixels is suppressed. In addition, since the black pixels 111C are arranged evenly, a two-dimensional black level change can be corrected appropriately.

Figure 31:
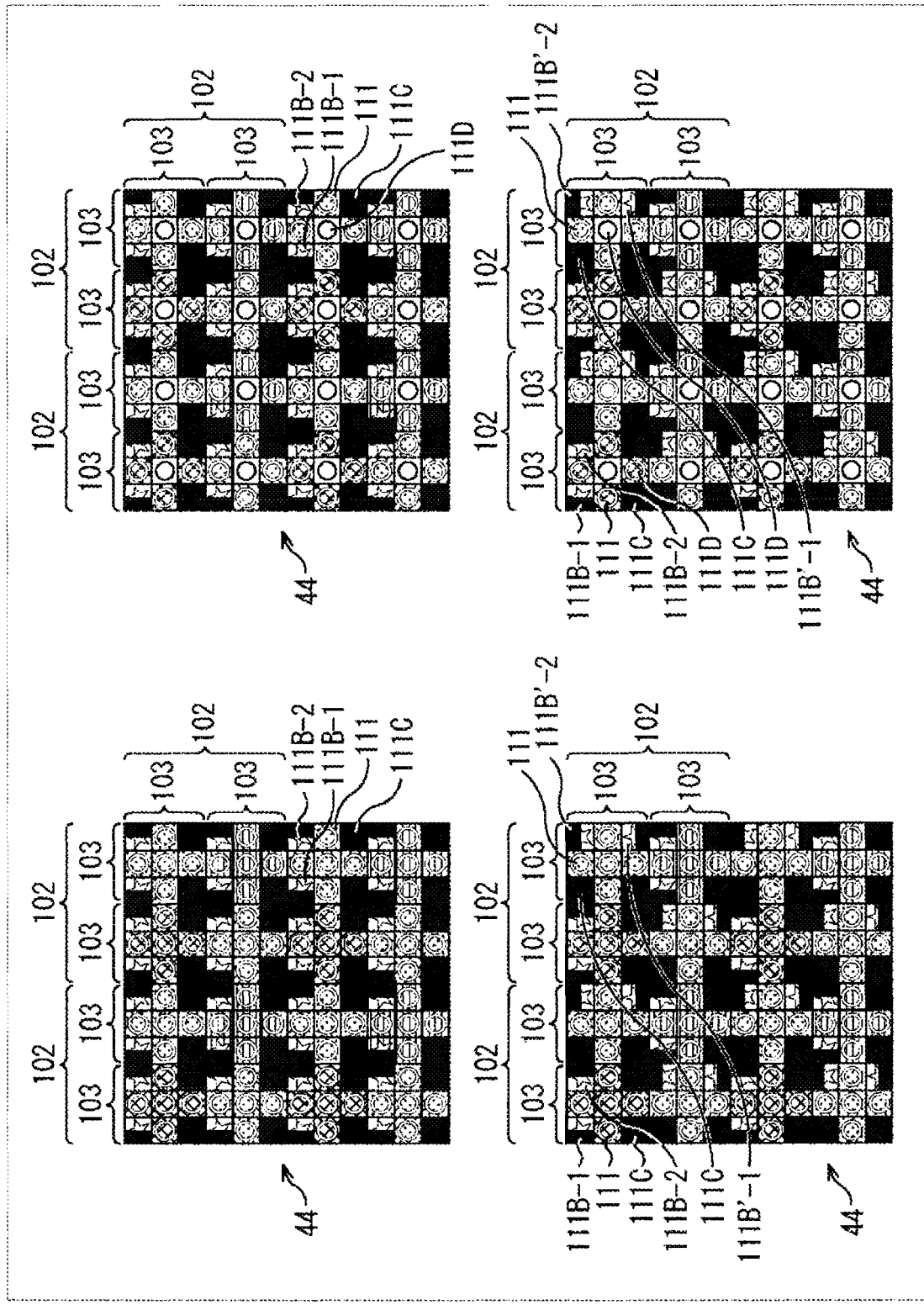
FIG. 31 is a diagram describing variations of pixel arrangement example.

Further, as shown at the upper left part of FIG. 31, the phase difference detection pixels 111B-1 and 111B-2 may be arranged at the upper left and right parts of the central pixel, the black pixels 111C may be arranged at the lower left and right parts, and the remaining five pixels may be the normal pixels 111 on the subblock 103 basis.

In addition, as shown at the lower left part of FIG. 31, for the G subblock 103, the phase difference detection pixels 111B'-1 and 111B'-2 may be arranged at the upper and lower right parts of the central pixel, the black pixels 111C may be arranged at the upper and lower left parts, and the remaining five pixels may be the normal pixels 111, and for the R and B subblocks 103, the phase difference detection pixels 111B-1 and 111B-2 may be arranged at the upper left and right parts of the central pixel, the black pixels 111C may be arranged at the lower left and right parts, and the remaining five pixels may be the normal pixels 111. Note that the arrangement of the RGB subblocks 103 in the Bayer array in each of the blocks 102 corresponds to that of FIG. 3.

Further, as shown at the upper right part of FIG. 31, the central pixel 111 within the subblock 103 may be replaced by the white pixel 111D with respect to the pixel arrangement at the upper left part of FIG. 31.

Similarly, as shown at the lower right part of FIG. 31, the central pixel 111 within the subblock 103 may be replaced by the white pixel 111D with respect to the pixel arrangement at the lower left part of FIG. 31.

Since the normal pixels 111 are arranged longitudinally and laterally symmetrically within the subblock 103 at each part of FIG. 31, occurrence of a phase shift can be suppressed.

In addition, the example in which the subblock 103 includes 3×3 pixels, nine pixels in total, has been described above, but the number of pixels constituting the subblock 103 may be another number of pixels, and the subblock 103 may include 4×4 pixels, for example.

Figure 32:
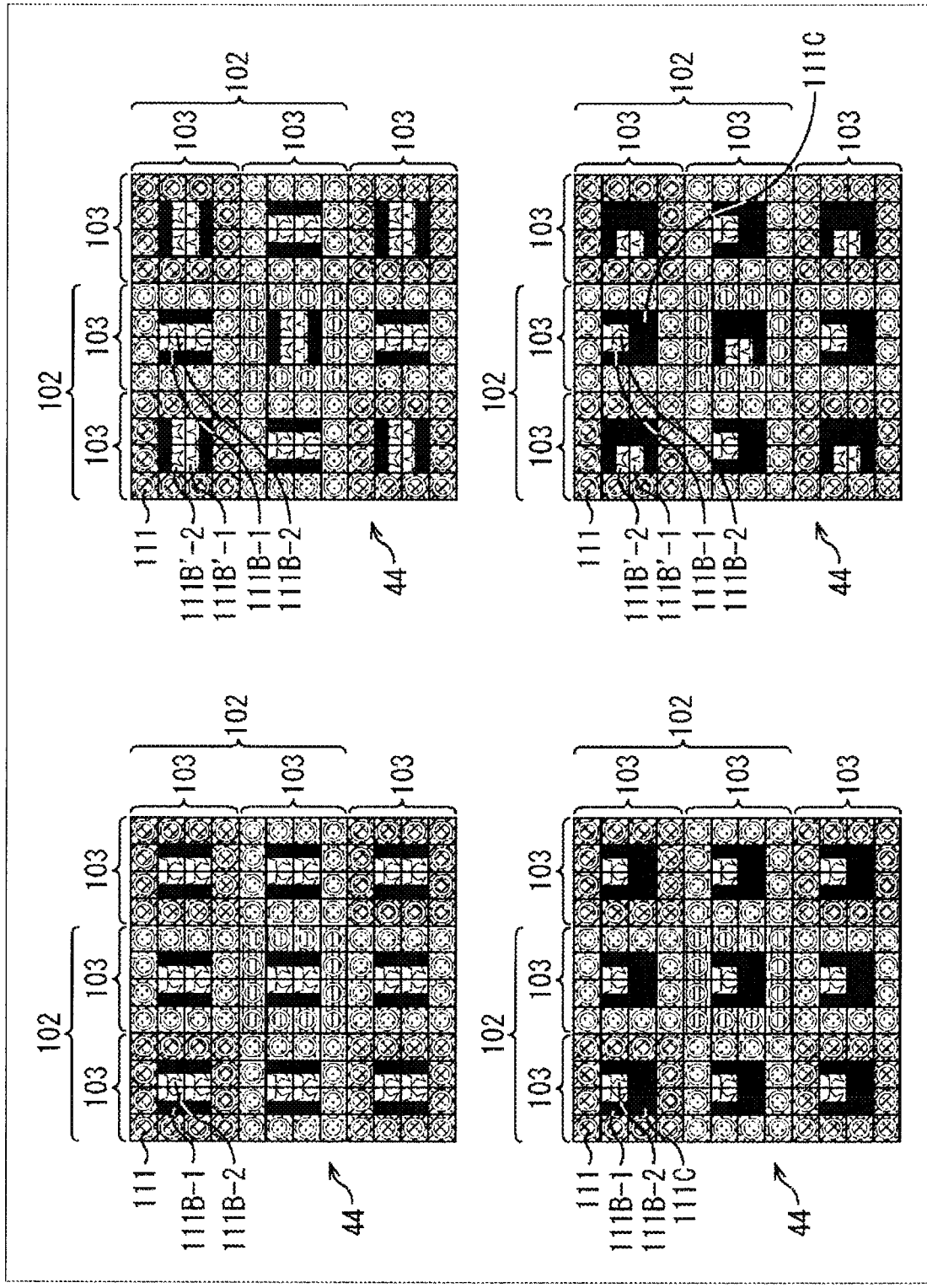
FIG. 32 is a diagram describing variations of pixel arrangement example.

As shown at the upper left part of FIG. 32, for example, the phase difference detection pixels 111B-1 and 111B-2 may be arranged on the left and right, respectively, for 2×2 pixels at the center of the subblock 103 including 4×4 pixels, and the normal pixels 111 may be arranged for the remaining twelve pixels.

In addition, as shown at the upper right part of FIG. 32, for example, the phase difference detection pixels 111B-1 and 111B-2 may be arranged on the left and right for 2×2 pixels at the center of the G subblock 103 among the subblocks 103 each including 4×4 pixels, and the normal pixels 111 may be arranged for the remaining twelve pixels, the phase difference detection pixels 111B'-1 and 111B'-2 may be arranged on the left and right for 2×2 pixels at the center of the B and R subblocks 103, and the normal pixels 111 may be arranged for the remaining twelve pixels.

Further, as shown at the lower left part of FIG. 32, for example, the phase difference detection pixels 111B-1 and 111B-2 may be arranged for two pixels in the upper stage at the center in the subblock 103 including 4×4 pixels, the black pixels 111C may be arranged for two pixels in the lower stage at the center, and the normal pixels 111 may be arranged for the remaining twelve pixels.

In addition, as shown at the lower right part of FIG. 32, for example, the phase difference detection pixels 111B-1 and 111B-2 may be arranged for two pixels in the upper stage at the center in the G subblock 103 among the subblocks 103 each including 4×4 pixels, the black pixels 111C may be arranged for two pixels in the lower stage at the center, and the normal pixels 111 may be arranged for the remaining twelve pixels, and the phase difference detection pixels 111B'-1 and 111B'-2 may be arranged for two pixels on the left side at the center in the B and R subblocks 103, the black pixels 111C may be arranged for two pixels on the right side at the center, and the normal pixels 111 may be arranged for the remaining twelve pixels.

Since the normal pixels 111 are arranged longitudinally and laterally symmetrically within the subblock 103 at each part of FIG. 32, occurrence of a phase shift can be suppressed.

Further, the subblock 103 may include 2×2 pixels.

Figure 33:
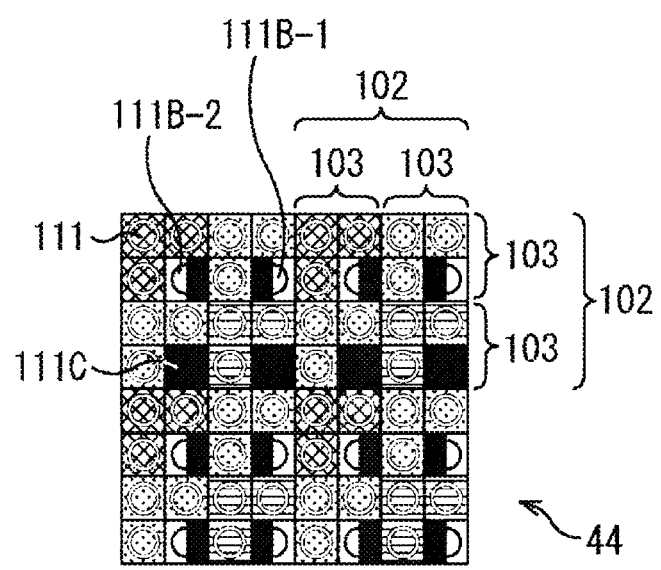
FIG. 33 is a diagram describing variations of pixel arrangement example.

As shown in FIG. 33, for example, for two upper-stage subblocks 103 constituting the block 102, the phase difference detection pixels 111B-1 and 111B-2 may be provided at the lower right part, and for two lower-stage subblocks 103 constituting the block 102, the black pixels 111C may be provided at the lower right part.

That is, ¼ pixels within the subblock 103 including 2×2 pixels are the functional pixels X.

Consequently, the functional pixels X are not only the phase difference detection pixels 111B and the black pixels 111C shown in FIG. 33, but may also be the white pixel 111D, the individual pixel 111A, and the like.

In this case, the normal pixels 111 are asymmetric in the vertical and horizontal directions on the subblock 103 basis, but since the arrangement of three pixels 111 to be added is identical in each subblock 103, a phase shift is suppressed. That is, if the arrangement of the pixels 111 to be used as normal addition pixels is identical on the subblock 103 basis, the arrangement may be asymmetric irrespective of the number of pixels constituting the subblock 103.

In addition, as long as the normal pixels 111 are configured longitudinally and laterally symmetrically in the subblock 103, various functional pixels 111X may be arranged at other positions in various combinations.

As described above, according to the electronic equipment of the present disclosure, degradation in image quality of a captured image can be suppressed even if any pixel in a pixel array is configured as a functional pixel dedicated for obtaining desired information in order to obtain information different from a normal image. Additionally, the present disclosure may also be configured as below.

<1> A solid state image sensor including:
an image sensor including a normal pixel including a pixel configured to capture an image and produce a corresponding pixel signal, and
a functional pixel including a pixel configured to produce a signal necessary for capturing the image, in which
the image captured by the image sensor includes a block which is a set of color units, the block is configured by arranging, for each color, a subblock including a plurality of pixels of an identical color in a predetermined color array, and
in an arrangement of the plurality of pixels included in the subblock, the normal pixels are arranged longitudinally and laterally symmetrically within the subblock.

<2> The solid state image sensor according to <1>, in which
the color array is a Bayer array, a stripe array, a checkboard array, or an interline array.

<3> The solid state image sensor according to <1> or <2>, in which respective pixel signals of the plurality of normal pixels included in the subblock are added and output as a pixel signal of normal addition pixels on the subblock basis.

<4> The solid state image sensor according to <3>, in which
the functional pixel is a pixel having a function identical to a function of the normal pixels, and captures the image in an exposure duration different from an exposure duration of the normal pixels and with an identical sensitivity.

<5> The solid state image sensor according to <3>, in which
the functional pixel is a pixel having a function identical to a function of the normal pixels, and captures the image in an exposure duration identical to an exposure duration of the normal pixels and with a different sensitivity.

<6> The solid state image sensor according to <3>, in which
the functional pixel is a phase difference detection pixel that detects a phase difference that conforms to a focal length.

<7> The solid state image sensor according to <6>, in which
after outputting a signal indicating the phase difference detected by the functional pixel including the phase difference detection pixel, the image sensor outputs the pixel signal of the normal pixels.

<8> The solid state image sensor according to <7>, further including:
a lens configured to adjust a focus of light incident on the image sensor; and
a lens control unit configured to control a focal length of the lens, in which
the lens control unit calculates a defocus amount of the lens in accordance with the phase difference detected by the phase difference detection pixel, and controls the focal length of the lens on the basis of the defocus amount.

<9> The solid state image sensor according to <6>, in which
the phase difference detection pixel detects a phase difference in a horizontal direction.

<10> The solid state image sensor according to <6>, in which
the phase difference detection pixel detects a phase difference in a vertical direction.

<11> The solid state image sensor according to <3>, in which
the functional pixel is a black pixel, and outputs a black level.

<12> The solid state image sensor according to <11>, in which
the black pixel is a pixel fully shielded from light.

<13> The solid state image sensor according to <11>, further including:
a clamp unit configured to subtract the black level of the black pixel from the pixel signal of the normal addition pixels for clamping.

<14> The solid state image sensor according to <3>, in which
the functional pixel is a white pixel, and outputs a luminance signal.

<15> The solid state image sensor according to <14>, in which
the white pixel is a pixel whose color filter is transparent or a pixel without the color filter.

<16> The solid state image sensor according to <14>, further including:
a low pass filter (LPF) unit configured to subject the pixel signal of the normal addition pixels to an (LPF);
a high pass filter (HPF) unit configured to subject the luminance signal to an HPF; and an addition unit configured to add an output of the LPF unit and an output of the HPF unit.

<17> The solid state image sensor according to any one of <1> to <16>, further including:
a column AD conversion unit configured to subject signals output from the pixels constituting the image sensor and arranged in an array to analog digital conversion on a row basis, in which
the column AD conversion units are provided by a multiple of the number of rows included in the subblock.

<18> Electronic equipment including:
an image sensor including a normal pixel including a pixel configured to capture an image and produce a corresponding pixel signal, and
a functional pixel including a pixel configured to produce a signal necessary for capturing the image, in which
the image captured by the image sensor includes a block which is a set of color units, the block is configured by arranging, for each color, a subblock including a plurality of pixels of an identical color in a predetermined color array, and
in an arrangement of the plurality of pixels included in the subblock, the normal pixels are arranged longitudinally and laterally symmetrically within the subblock.

REFERENCE SIGNS LIST

102 Block
103 Subblock
111 Pixel
114 Imaging pixel
131 Phase difference detection pixel
311 Lens
312 Optical filter
322 Clamp unit
323 Demosaic unit
325 Luminance chroma signal generation unit
326 Interface unit
330 Clamp unit
374 Phase difference detection unit
375 Lens control unit

The invention claimed is:

1. A light detecting device, comprising:
a first pixel block that includes nine pixels arranged in 3×3 matrix, wherein
the first pixel block includes a plurality of normal pixels of a first color filter and a first pixel, and
the first color filter is configured to transmit light in a first range of wavelengths; and
a second pixel block that includes nine pixels arranged in 3×3 matrix, wherein
the second pixel block includes a plurality of normal pixels of a second color filter and a second pixel,
the second color filter is configured to transmit light in a second range of wavelengths,
the first pixel is adjacent to the second pixel,
the first pixel is configured to output a signal to detect phase difference, and
the second pixel is configured to output the signal to detect the phase difference.

2. The light detecting device according to claim 1, wherein
the plurality of normal pixels of the first color filter is in a first color array,
the plurality of normal pixels of the second color filter is in a second color array, and
each of the first color array and the second color array is a Bayer array.

3. A light detecting device, comprising:
a first pixel block that includes nine pixels arranged in 3×3 matrix, wherein
the first pixel block includes a plurality of normal pixels of a first color filter and a first pixel, and
the first color filter is configured to transmit light in a first range of wavelengths; and
a second pixel block that includes nine pixels arranged in 3×3 matrix, wherein
the second pixel block includes a plurality of normal pixels of a second color filter and a second pixel,
the second color filter is configured to transmit light in a second range of wavelengths, and
the first pixel is adjacent to the second pixel.

4. The light detecting device according to claim 3, wherein
- the plurality of normal pixels of the first color filter is in a first color array,
- the plurality of normal pixels of the second color filter is in a second color array, and
- each of the first color array and the second color array is a Bayer array.

5. The light detecting device according to claim 1, further comprising a third pixel block that includes nine pixels arranged in 3×3 matrix.

6. The light detecting device according to claim 5, wherein the third pixel block includes the plurality of normal pixels of the second color filter and a third pixel.

7. The light detecting device according to claim 6, further comprising a fourth pixel block that includes nine pixels arranged in 3×3 matrix.

8. The light detecting device according to claim 7, wherein the fourth pixel block includes a plurality of normal pixels of a third color filter and a fourth pixel.

9. The light detecting device according to claim 6, wherein the third pixel is configured to output the signal to detect the phase difference.

10. The light detecting device according to claim 8, wherein the fourth pixel is configured to output the signal to detect the phase difference.

11. The light detecting device according to claim 8, wherein the third pixel is adjacent to the fourth pixel.

\* \* \* \* \*